US012593518B2

(12) United States Patent
Lim et al.

(10) Patent No.: US 12,593,518 B2
(45) Date of Patent: Mar. 31, 2026

(54) IMAGE SENSOR AND OPERATION METHOD THEREOF

(71) Applicant: Samsung Electronics Co., Ltd., Suwon-si (KR)

(72) Inventors: Jungwook Lim, Suwon-si (KR); Eun Sub Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 550 days.

(21) Appl. No.: 18/093,035

(22) Filed: Jan. 4, 2023

(65) Prior Publication Data

US 2023/0253436 A1     Aug. 10, 2023

(30) Foreign Application Priority Data

Feb. 7, 2022    (KR) ......................... 10-2022-0015802
Apr. 28, 2022    (KR) ......................... 10-2022-0052722

(51) Int. Cl.
  H10F 39/18       (2025.01)
  H04N 25/59       (2023.01)
  H10F 39/00       (2025.01)
(52) U.S. Cl.
  CPC ............. H10F 39/18 (2025.01); H04N 25/59 (2023.01); H10F 39/802 (2025.01); H10F 39/8037 (2025.01); H10F 39/811 (2025.01)
(58) Field of Classification Search
  CPC .... H10F 39/18; H10F 39/802; H10F 39/8037; H10F 39/811; H10F 39/803; H10F

39/80373; H10F 39/813; H04N 25/59; H04N 25/57; H04N 25/585; H04N 23/741

See application file for complete search history.

(56) References Cited

U.S. PATENT DOCUMENTS

| | | | | |
|---|---|---|---|---|
| 7,816,714 B2* | 10/2010 | Hwang | ................. | H10F 39/811 |
| | | | | 257/292 |
| 8,952,433 B2 | 2/2015 | Inui | | |
| 10,356,351 B1 | 7/2019 | Ebihara et al. | | |
| 11,011,559 B2 | 5/2021 | Yun et al. | | |
| 11,044,427 B2 | 6/2021 | Shim et al. | | |
| 2006/0227233 A1* | 10/2006 | Fossum | ................. | H04N 25/62 |
| | | | | 348/308 |

(Continued)

FOREIGN PATENT DOCUMENTS

| | | |
|---|---|---|
| KR | 1020070062032 A | 6/2007 |
| KR | 100937320 B1 | 1/2010 |
| KR | 1020130062188 A | 6/2013 |

*Primary Examiner* — Abdelaaziz Tissire

(74) *Attorney, Agent, or Firm* — Muir Patent Law, PLLC

(57)       ABSTRACT

Disclosed is an image sensor which includes a photo diode that generates charges based on an incident light, a first floating diffusion region that stores the charges generated by the photo diode, a first boosting capacitor that is connected with the first floating diffusion region, a second floating diffusion region that is disposed to be spaced from the first floating diffusion region and includes a first end connected with a gate of a drive transistor, a transfer transistor that electrically connects the photo diode with the first floating diffusion region in response to a transfer signal, and a floating diffusion region transistor that electrically connects the first floating diffusion region with the second floating diffusion region in response to a floating control signal.

16 Claims, 20 Drawing Sheets

112.8

(56)     References Cited

U.S. PATENT DOCUMENTS

| | | | |
|---|---|---|---|
| 2011/0121162 A1* | 5/2011 | Murata | H04N 25/771 |
| | | | 250/214 P |
| 2011/0221940 A1* | 9/2011 | Kato | H04N 25/78 |
| | | | 348/E5.079 |
| 2011/0227044 A1* | 9/2011 | Kawanaka | H10D 64/647 |
| | | | 977/734 |
| 2012/0153126 A1* | 6/2012 | Oike | H10F 39/8057 |
| | | | 250/208.1 |
| 2013/0141619 A1* | 6/2013 | Lim | H04N 25/771 |
| | | | 250/214.1 |
| 2013/0256510 A1 | 10/2013 | Lyu | |
| 2015/0372038 A1* | 12/2015 | Lee | H10F 39/803 |
| | | | 257/435 |
| 2016/0020235 A1* | 1/2016 | Yamashita | H10F 39/811 |
| | | | 250/206 |
| 2016/0329024 A1* | 11/2016 | Maeda | G09G 3/3648 |
| 2017/0018587 A1* | 1/2017 | Ohmaru | H10F 39/8027 |
| 2017/0180703 A1* | 6/2017 | Kovacovsky | H04N 25/779 |
| 2018/0278810 A1* | 9/2018 | Webster | H03K 19/0027 |
| 2018/0288350 A1* | 10/2018 | Dupont | H04N 25/78 |
| 2020/0221047 A1* | 7/2020 | Oh | H04N 25/771 |
| 2020/0357835 A1 | 11/2020 | Ma | |

* cited by examiner

TR turn-on

TR turn-off

TR turn-on

TR turn-off

FDB1     positive     negative

FDB2     positive

Vpix

C1

C2

IMAGE SENSOR AND OPERATION METHOD THEREOF

CROSS-REFERENCE TO RELATED APPLICATIONS

This application claims priority under 35 U.S.C. § 119 to Korean Patent Application No. 10-2022-0015802, filed on Feb. 7, 2022, and Korean Patent Application No. 10-2022-0052722, filed on Apr. 28, 2022, in the Korean Intellectual Property Office, the disclosures of both of which are incorporated by reference herein in their entireties.

BACKGROUND

Embodiments of the present disclosure described herein relate to an image sensor.

An image sensor refers to a device that converts an optical image into an electrical signal. With the development of the computer industry and the communication industry, nowadays, there is an increasing demand on a high-performance image sensor in various electronic devices such as a digital camera, a camcorder, a personal communication system (PCS), a game console, a security camera, a medical micro camera, and a robot.

To implement a high-definition image sensor, charges generated by a photo diode should move toward a node, at which a sensing operation is performed, without loss. Accordingly, there is required a technology for implementing the above function.

SUMMARY

Embodiments of the present disclosure provide an image sensor capable of allowing charges generated by a photo diode to move toward anode, at which a sensing operation is performed, without loss.

According to an embodiment, an image sensor includes a photo diode that generates charges based on an incident light, a first floating diffusion region that stores the charges generated by the photo diode, a first boosting capacitor that is connected with the first floating diffusion region, a second floating diffusion region that is disposed to be spaced apart from the first floating diffusion region and includes a first end connected with a gate of a drive transistor, a transfer transistor that electrically connects the photo diode with the first floating diffusion region in response to a transfer signal, and a floating diffusion region transistor that electrically connects the first floating diffusion region with the second floating diffusion region in response to a floating control signal.

According to an embodiment, an image sensor includes a photo diode that generates a charge in response to an incident light, a first floating diffusion region that stores the charges generated by the photo diode, a first reset transistor that connects a first power supply voltage terminal with the first floating diffusion region in response to a first reset signal, a second floating diffusion region that is disposed to be spaced apart from the first floating diffusion region and includes a first end connected with a gate of a drive transistor, a second reset transistor that connects a second power supply voltage terminal different from the first power supply voltage terminal with the second floating diffusion region in response to a second reset signal, a transfer transistor that electrically connects the photo diode with the first floating diffusion region in response to a transfer signal, and a floating diffusion region transistor that electrically connects the first floating diffusion region with the second floating diffusion region in response to a floating control signal.

According to an embodiment, an image sensor includes a photo diode that generates a charge in response to an incident light, a first floating diffusion region and a second floating diffusion region that store charges generated by the photo diode, a transfer transistor that electrically connects the photo diode with the first floating diffusion region in response to a transfer signal, and a floating diffusion region transistor that includes a source region connected with the first floating diffusion region and a drain region connected with the second floating diffusion region and electrically connects the first floating diffusion region with the second floating diffusion region in response to a floating control signal, and a width of the source region in a first direction is smaller than a width of the drain region in the first direction, when viewed in a horizontal direction.

According to an embodiment, a driving method of an image sensor includes turning on a transfer transistor to transfer charges generated by a photo diode to at least two floating diffusion regions that are electrically connected, sampling a voltage formed in the at least two floating diffusion regions that are electrically connected, decreasing a voltage level of a first floating diffusion region connected with the transfer transistor from among the at least two floating diffusion regions, transferring charges of the first floating diffusion region to at least one floating diffusion region different from the first floating diffusion region, and sampling a voltage formed in the at least one floating diffusion region.

BRIEF DESCRIPTION OF THE FIGURES

The above and other objects and features of the present disclosure will become apparent by describing in detail embodiments thereof with reference to the accompanying drawings.

FIG. 5 is a timing diagram illustrating a method of driving a unit pixel of FIG. 2.

FIGS. 6A to 6D are diagrams illustrating a potential state of a unit pixel of FIG. 2.

DETAILED DESCRIPTION

Below, embodiments of the present disclosure will be described in detail and clearly to enable one of ordinary skill in the art to implement the invention.

Figure 1:
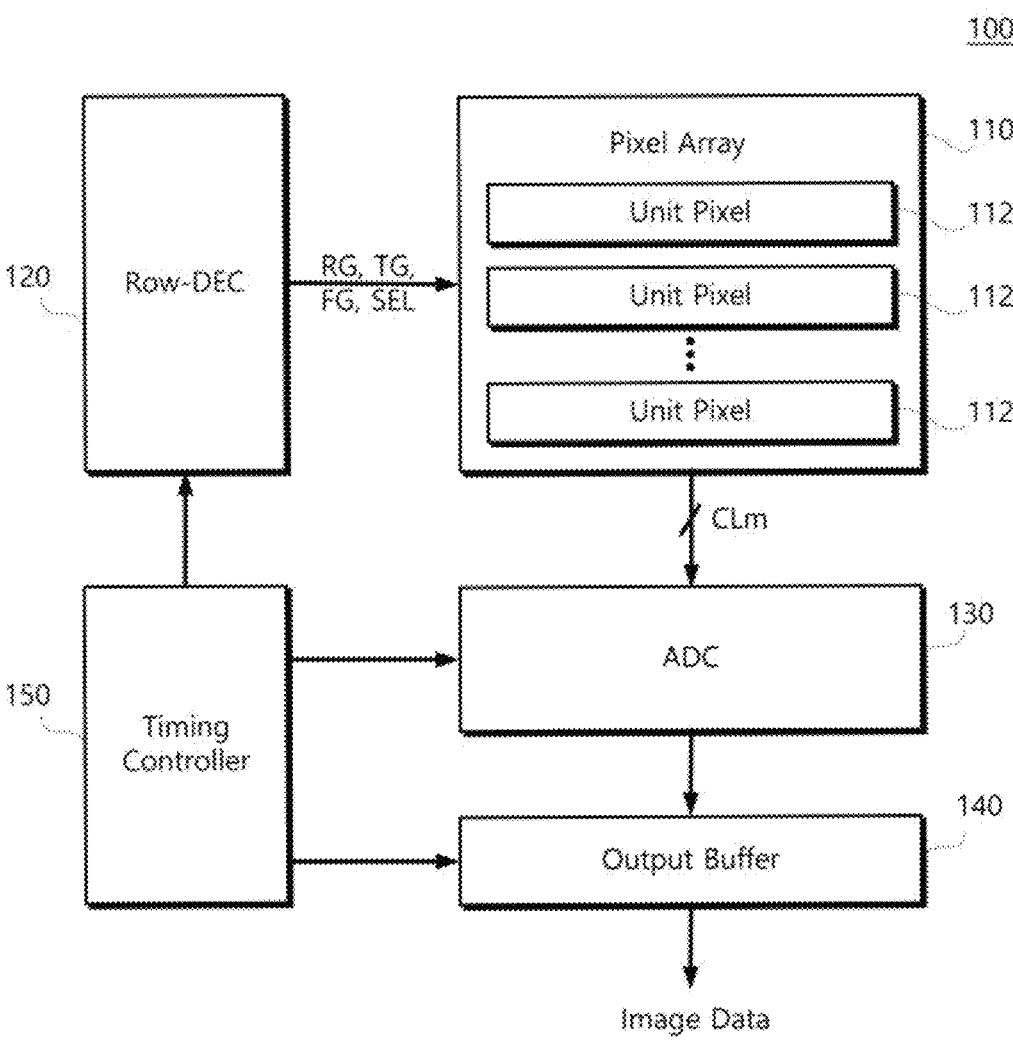
FIG. 1 is a block diagram illustrating an image sensor, according to an example embodiment of the present disclosure.

FIG. 1 is a block diagram illustrating an image sensor according to an example embodiment of the present disclosure. Referring to FIG. 1, an image sensor 100 includes a pixel array 110, a row decoder 120, an analog-to-digital converter (ADC) 130, an output buffer 140, and a timing controller 150.

The pixel array 110 includes a plurality of unit pixels 112. The plurality of unit pixels 112 may be arranged, for example, in the shape of a matrix. The pixel array 110 may receive pixel driving signals, such as a selection signal SEL, a reset signal RG, a transfer signal TG, and a floating control signal FG. The pixel array 110 may operate in response to the received pixel driving signals, and each of the unit pixels 112 may convert a light signal into an electrical signal. The electrical signals respectively generated by the unit pixels 112 may be provided to the analog-to-digital converter 130 through a plurality of column lines CLm.

According to an embodiment of the present disclosure, the plurality of unit pixels 112 included in the pixel array 110 may respectively include floating diffusion regions that are physically spaced apart from each other. A floating diffusion region transistor may be disposed between floating diffusion regions. In response to the floating control signal FG, the floating diffusion region transistor may connect the floating diffusion regions or may block the connection between the floating diffusion regions.

In particular, to prevent a charge injection phenomenon in which charges integrated in a channel under a gate of the floating diffusion region transistor during a turn-on time moves to a source thereof when the floating diffusion region transistor is turned off and the signal loss due to the charge injection phenomenon, the floating diffusion region transistor according to an embodiment of the present disclosure may be implemented to have an asymmetric potential structure allowing charges to easily move to a drain or to have an asymmetric device structure between the source and the drain. As such, charges generated by a photo diode may move to a node, at which a sensing operation is performed, without the loss. A structure and an operation of each of the unit pixels 112 according to an embodiment of the present disclosure will be described in detail with reference to the following drawings.

The row decoder 120 may select one of rows of the pixel array 110 under control of the timing controller 150. The row decoder 120 may generate the selection signal SEL for the purpose of selecting one of the plurality of rows. The row decoder 120 may activate the reset signal RG, the transfer signal TG, and the floating control signal FG with respect to unit pixels corresponding to the selected row, based on a given order. Afterwards, a reset level signal and a sensing signal that are generated from each of the unit pixels 112 in the selected row may be transferred to the analog-to-digital converter 130.

The analog-to-digital converter 130 may convert and output the reset level signal and the sensing signal into a digital signal. For example, the analog-to-digital converter 130 may sample the reset level signal and the sensing signal in a correlated double sampling scheme and may convert a sampling result into a digital signal. To this end, a correlated double sampler (CDS) may be further disposed in front of the analog-to-digital converter 130 (not illustrated).

The output buffer 140 may latch and output image data provided from the analog-to-digital converter 130 in column units (e.g., each unit comprising a column). The output buffer 140 may temporarily store image data output from the analog-to-digital converter 130 under control of the timing controller 150 and may then sequentially output the latched (or temporarily stored) image data by a column decoder (not illustrated).

The timing controller 150 may control the pixel array 110, the row decoder 120, the analog-to-digital converter 130, the output buffer 140, etc. The timing controller 150 may supply control signals, such as a clock signal and a timing control signal, to the pixel array 110, the row decoder 120, the analog-to-digital converter 130, the output buffer 140, etc. The timing controller 150 may include a logic control circuit, a phase locked loop (PLL) circuit, a timing control circuit, a communication interface circuit, etc.

The configuration of the image sensor 100 according to an embodiment of the present disclosure is briefly described above. According to an embodiment of the present disclosure, each of the unit pixels 112 constituting the pixel array 110 may include a floating diffusion region transistor that electrically connects different floating diffusion regions or blocks the electrical connection between the different floating diffusion regions, and the floating diffusion region transistor may have an asymmetric potential structure or an asymmetric device structure between a source and a drain thereof. As such, charges generated by a photo diode may move to a node, at which a sensing operation is performed, without the loss, and thus, the image quality of the image sensor 100 may be improved.

[Image Sensor Providing Dual-Conversion Gain Mode]

Figure 2:
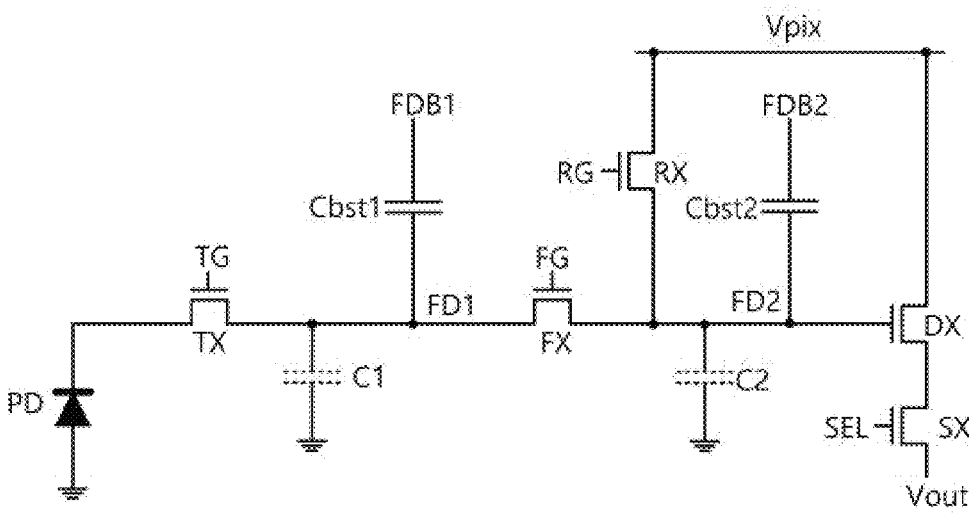
FIG. 2 is a circuit diagram illustrating a unit pixel, according to an example embodiment of the present disclosure.

FIG. 2 is a circuit diagram illustrating the unit pixel 112 according to an example embodiment of the present disclosure, and FIGS. 3A, 3B, 4A, and 4B are diagrams for describing an operation of a floating diffusion region transistor FX included in the unit pixel 112 of FIG. 2.

The unit pixel 112 according to an embodiment of the present disclosure may support a dual conversion gain mode that provides a high conversion gain (HCG) and a low conversion gain (LCG). In particular, in a low-illuminance mode in which the high conversion gain HCG is provided, charges stored in a first floating diffusion region FD1 may move to a second floating diffusion region FD2 without the loss. To this end, the floating diffusion region transistor FX may have an asymmetric potential structure.

Referring to FIG. 2, the unit pixel 112 may include one photo diode PD, five NMOS transistors TX, FX, RX, DX, and SX, and two boosting capacitors Cbst1 and Cbst2.

The photo diode PD refers to a light sensing element that generates and integrates charges depending on the amount of incident light or the intensity of light. The photo diode PD may also be implemented with a photo transistor, a photo gate, a pinned photo diode (PPD), an organic photo diode (OPD), a quantum dot (QD), etc.

The transfer transistor TX may be turned on or turned off in response to the transfer signal TG provided from the row decoder 120 and may transfer charges integrated by the photo diode PD to the first floating diffusion region FD1. For example, the first floating diffusion region FD1 may store the charges generated by the photo diode PD.

The floating diffusion region transistor FX is disposed between the first floating diffusion region FD1 and the second floating diffusion region FD2. In response to the floating control signal FG, the floating diffusion region transistor FX may electrically connect the first floating diffusion region FD1 and the second floating diffusion region FD2 or may disconnect the first floating diffusion region FD1 from the second floating diffusion region FD2.

A floating diffusion region may include the first floating diffusion region FD1 and the second floating diffusion region FD2 that are physically separated from each other. A first end of the first floating diffusion region FD1 may be connected with a drain of transfer transistor TX, and a second end thereof may be connected with a source of the floating diffusion region transistor FX. A first end of the second floating diffusion region FD2 may be connected with a drain of the floating diffusion region transistor FX, and a second end thereof may be connected with a gate of the drive transistor DX that is driven as a source follower amplifier.

The first boosting capacitor Cbst1 is connected with the first floating diffusion region FD1. The first boosting capacitor Cbst1 may be coupled to the first floating diffusion region FD1 to increase or decrease a voltage level of the first floating diffusion region FD1. For example, when a positive voltage is provided through a first boosting signal FDB1, the voltage level of the first floating diffusion region FD1 may increase. For another example, when a negative voltage is provided through the first boosting signal FDB1, the voltage level of the first floating diffusion region FD1 may decrease.

The second boosting capacitor Cbst2 is connected with the second floating diffusion region FD2. Only a positive voltage may be provided through a second boosting signal FDB2, and the second boosting capacitor Cbst2 may be coupled to the second floating diffusion region FD2 to increase a voltage level of the second floating diffusion region FD2.

The first boosting capacitor Cbst1 and the second boosting capacitor Cbst2 may be formed in various manners. For example, a first boosting metal (Boosting Metal 1) may be provided to form the first boosting capacitor Cbst1. The first boosting metal may be disposed parallel to a metal (hereinafter referred to as a "first FD metal") constituting the first floating diffusion region FD1. As such, the first boosting capacitor Cbst1 may be formed between the first boosting metal and the first FD metal. Likewise, a second boosting metal (Boosting Metal 2) that is disposed parallel to a metal (hereinafter referred to as a "second FD metal") constituting the second floating diffusion region FD2 may be provided to form the second boosting capacitor Cbst2.

Also, as another embodiment, the first and second boosting capacitors Cbst1 and Cbst2 may be implemented by a method for forming a metal on an insulator above (or over) the first and second floating diffusion regions FD1 and FD2. In general, an insulator is formed above (or over) a floating diffusion region. Accordingly, when a metal is formed on the insulator above the floating diffusion region, the metal may constitute one electrode of a boosting capacitor. Accordingly, the first and second boosting capacitors Cbst1 and Cbst2 may be formed by forming the first and second boosting metals on the insulator above (or over) the first and second floating diffusion regions FD1 and FD2, respectively. In this case, values of the first and second boosting capacitors Cbst1 and Cbst2 may be controlled by adjusting a thickness or a material of an insulator of a region where a boosting capacitor is defined.

The reset transistor RX may reset the first and second floating diffusion regions FD1 and FD2 in response to the reset signal RG. For example, as illustrated in FIG. 2, a source of the reset transistor RX may be connected with the second floating diffusion region FD2. When the reset signal RG is activated in a state where the floating control signal FG is activated, the reset transistor RX is turned on, and a power supply voltage Vpix is transferred to the first and second floating diffusion regions FD1 and FD2. In this case, charges integrated in the first and second floating diffusion regions FD1 and FD2 may be drained to a terminal for the power supply voltage Vpix, and voltages of the first and second floating diffusion regions FD1 and FD2 may be reset to a level of the power supply voltage Vpix.

Meanwhile, an example in which the reset transistor RX is connected with the second floating diffusion region FD2 is illustrated in FIG. 2, but the present disclosure is not limited thereto. For example, the reset transistor RX may be connected with the first floating diffusion region FD1.

A gate of the drive transistor DX may be connected with the second floating diffusion region FD2 and may serve as a source follower amplifier. For example, the drive transistor DX may amplify a potential change of the second floating diffusion region FD2 or a potential change of the first and second floating diffusion regions FD1 and FD2 that are electrically connected, and may transfer the amplified potential change to one of the column lines CLm through the select transistor SX.

The select transistor SX is used to select a unit pixel to be read out in row units (e.g., each unit comprising a row). The select transistor SX may be driven by the selection signal SEL provided in row units. When the select transistor SX is turned on, a potential of the second floating diffusion region FD2 or a potential of the first and second floating diffusion regions FD1 and FD2 that are electrically connected may be amplified and transferred to a drain of the select transistor SX through the drive transistor DX.

According to an embodiment of the present disclosure, in a high-illumination mode, the transfer transistor TX may be turned on in a state where the floating diffusion region transistor FX may be turned on. In this case, charges integrated by the photo diode PD may move to the first and second floating diffusion regions FD1 and FD2, with the first floating diffusion region FD1 and the second floating diffusion region FD2 electrically connected. Afterwards, a voltage level of the first and second floating diffusion regions FD1 and FD2 may be sampled. Because a sampling operation is performed by using charges stored in a capacity (i.e., C1+C2) provided by the first and second floating diffusion regions FD1 and FD2, a relatively low conversion gain LCG may be provided, and a sampling value may be used as information about an image sensed under relatively high illumination.

According to an embodiment of the present disclosure, in the low-illuminance mode, charges belonging to the first floating diffusion region FD1 from among charges integrated in the first and second floating diffusion regions FD1 and FD2 may move to the second floating diffusion region FD2. To this end, the asymmetric potential structure may be formed with respect to the floating diffusion region transistor FX.

In detail, a negative voltage may be provided through the first boosting signal FDB1, and a positive voltage may be provided through the second boosting signal FDB2. As such, a voltage level of the first floating diffusion region FD1 and the source of the floating diffusion region transistor FX connected with the first floating diffusion region FD1 may decrease, and a voltage level of the second floating diffusion region FD2 and the drain of the floating diffusion region transistor FX connected with the second floating diffusion region FD2 may increase. As such, the asymmetric potential structure that allows charges to easily move from the source to the drain may be formed. Afterwards, when the floating diffusion region transistor FX is turned on, charges integrated in the first floating diffusion region FD1 may move to the second floating diffusion region FD2. Then, the floating diffusion region transistor FX may be turned off, and the voltage level of the second floating diffusion region FD2 may be sampled. Because the sampling operation is performed by using only charges stored in the capacity C2 provided by the second floating diffusion region FD2, a relatively high conversion gain HCG may be provided.

Figure 3A:
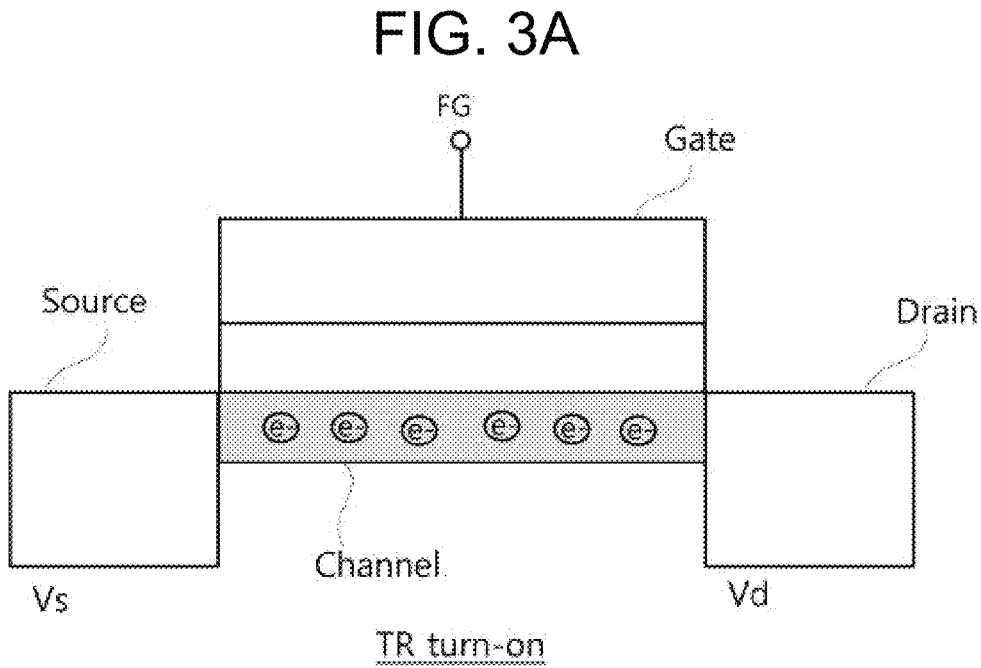
FIGS. 3A, 3B, 4A, and 4B are diagrams for describing an operation of a floating diffusion region transistor included in a unit pixel of FIG. 2.
Figure 3B:
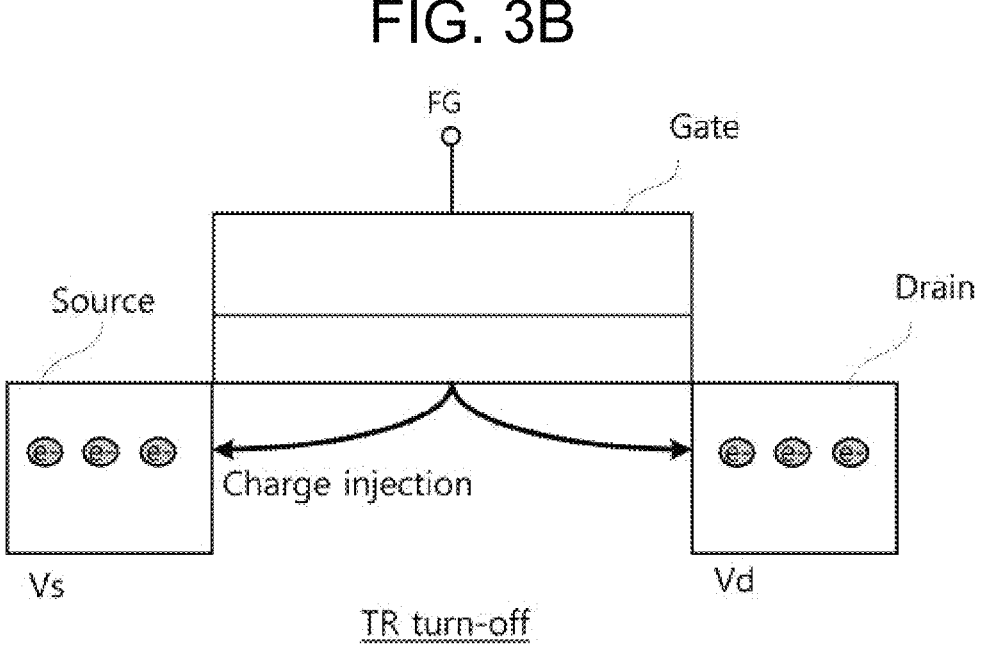

In general, as illustrated in FIGS. 3A and 3B, when a transistor is turned on and then is turned off, charges present in a channel under a gate may move depending on a resistance ratio between the source and the drain. In this case, the signal loss may occur as much as the amount of charges moving to the source.

Figure 4A:
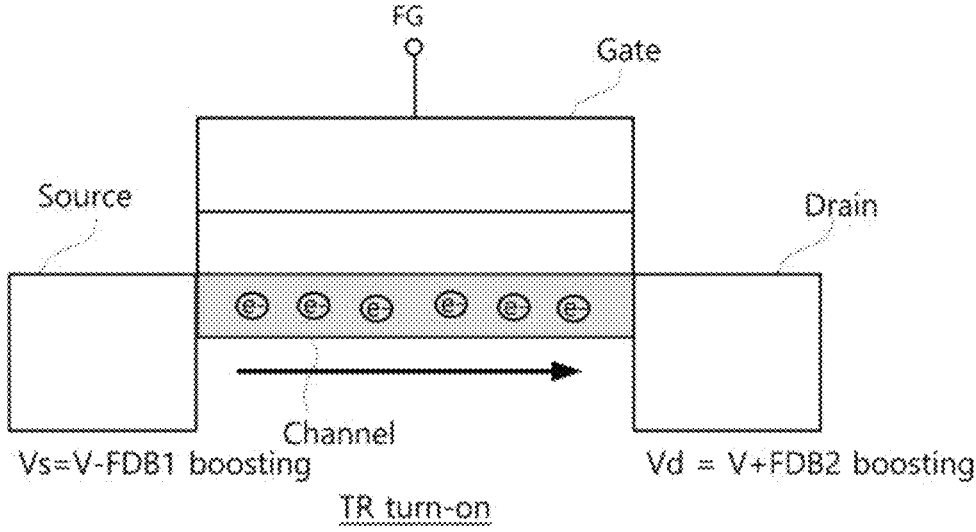
Figure 4B:
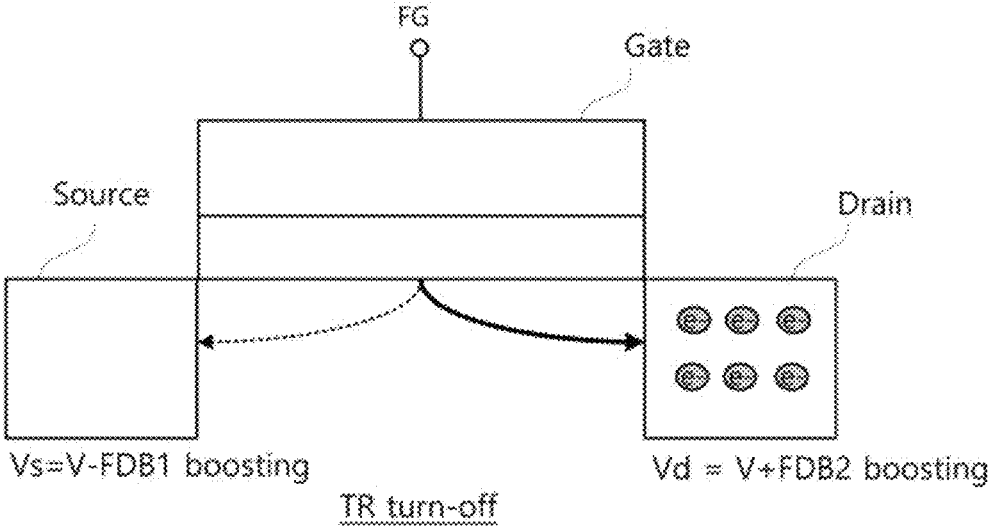

In contrast, as illustrated in FIGS. 4A and 4B, the floating diffusion region transistor FX according to an example embodiment of the present disclosure forms the asymmetric potential structure between the source and the drain before the floating diffusion region transistor FX is turned off. For example, a voltage level Vs of the source may be decreased by the first boosting signal FDB1, and a voltage level Vd of the drain may be increased by the second boosting signal FDB2. As such, the asymmetric potential structure may be formed. Afterwards, when the floating diffusion region transistor FX is turned off, charges present in the channel may move only to the drain by the asymmetric potential structure. According to the above description, the signal loss due to the charge injection may be minimized, and thus, charges generated by the photo diode may move to a node at which the sensing operation is performed, without the loss.

Figures 5, 6A:
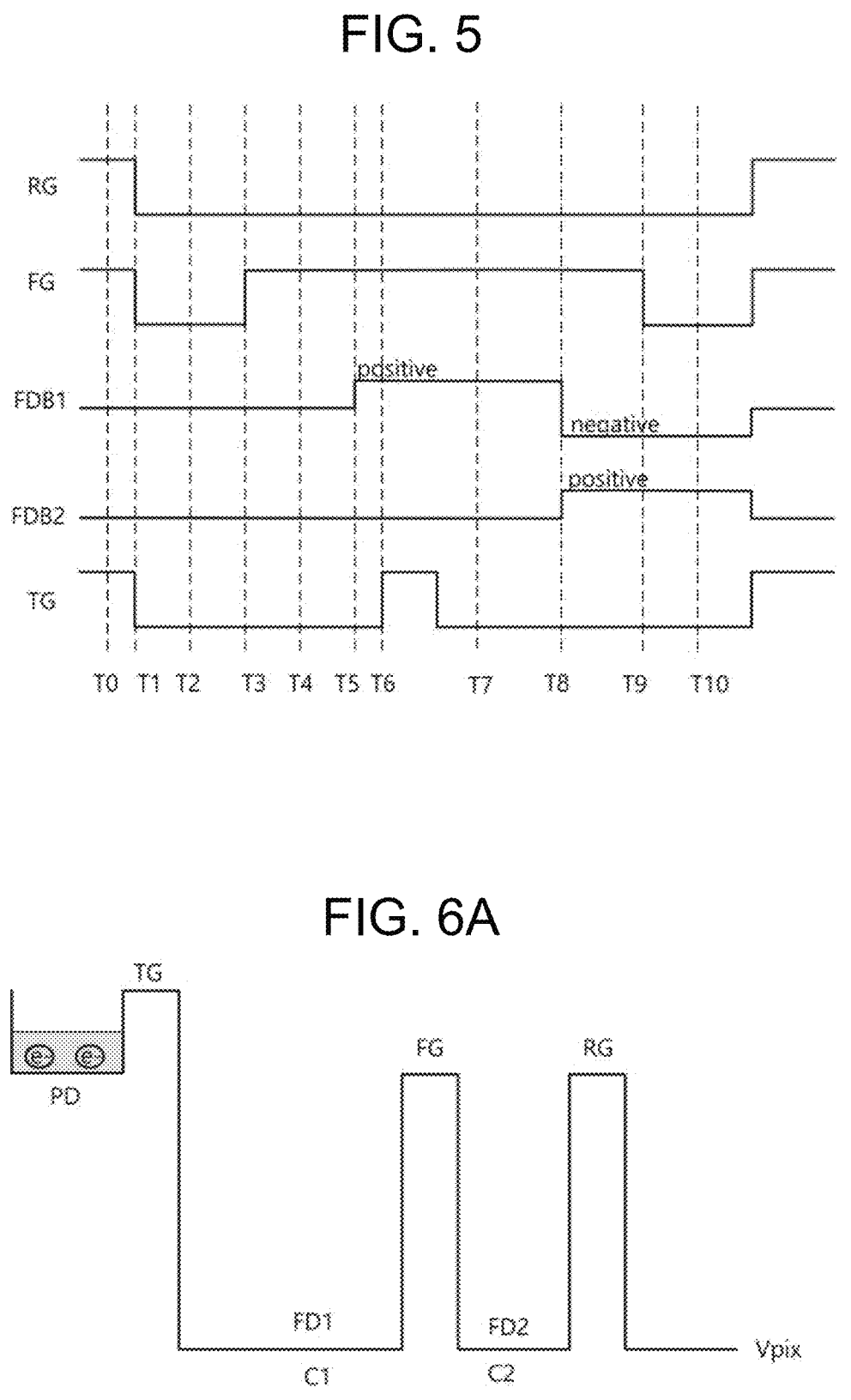

FIG. 5 is a timing diagram illustrating a method of driving a unit pixel of FIG. 2, and FIGS. 6A to 6D are diagrams illustrating a potential state of a unit pixel of FIG. 2.

Referring to FIG. 5, at point in time T0, the reset signal RG, the floating control signal FG, and the transfer signal TG provided to the unit pixel 112 are at a high level. In this case, the reset transistor RX is turned on, and thus, the terminal for the power supply voltage Vpix is electrically connected with the first floating diffusion region FD1, the second floating diffusion region FD2, and the photo diode PD. Accordingly, charges present in the first floating diffusion region FD1, the second floating diffusion region FD2, and the photo diode PD are drained to the terminal for the power supply voltage Vpix. This means that the first floating diffusion region FD1, the second floating diffusion region FD2, and the photo diode PD are reset.

At point in time T1, the reset signal RG, the floating control signal FG, and the transfer signal TG transition to a low level. In this case, the reset transistor RX, the floating diffusion region transistor FX, and the transfer transistor TX are turned off. According to the above condition, the first floating diffusion region FD1 and the second floating diffusion region FD2 are electrically disconnected from each other and are in a floating state.

At point in time T2, a voltage level of the second floating diffusion region FD2 is sampled. As illustrated in FIG. 6A, the second floating diffusion region FD2 may be separated from the first floating diffusion region FD1 by a potential barrier of the floating diffusion region transistor FX. The voltage level of the second floating diffusion region FD2 may be defined as a first reference voltage (1st reference voltage) and may be used as a reference voltage in the low-illuminance mode.

At point in time T3, the floating control signal FG transitions to the high level. In this case, the first floating diffusion region FD1 and the second floating diffusion region FD2 are electrically connected with each other.

At point in time T4, a voltage level of the first and second floating diffusion regions FD1 and FD2 that are electrically connected is sampled. It may be confirmed from FIG. 6B that, as the first and second floating diffusion regions FD1 and FD2 are connected with each other, a full capacity capable of containing charges is increased. For example, it may be confirmed that a full capacity corresponds to a sum "C1+C2" of the capacity C1 of the first floating diffusion region FD1 and the capacity C2 of the second floating diffusion region FD2. The voltage level of the first and second floating diffusion regions FD1 and FD2 may be defined as a second reference voltage (2nd reference voltage) and may be used as a reference voltage in the high-illumination mode.

At point in time T5, a positive voltage is provided through the first boosting signal FDB1. Because the first and second floating diffusion regions FD1 and FD2 are electrically connected with each other at point in time T5, the voltage level of the first and second floating diffusion regions FD1 and FD2 may increase. As such, charges integrated by the photo diode PD may easily move to the first and second floating diffusion regions FD1 and FD2. For example, the asymmetric potential structure that allows charges of the photo diode PD to easily move is formed with respect to the transfer transistor TX.

At point in time T6, the transfer signal TG transitions to the high level. As such, charges integrated by the photo diode PD moves to the first and second floating diffusion regions FD1 and FD2.

Figure 6B:
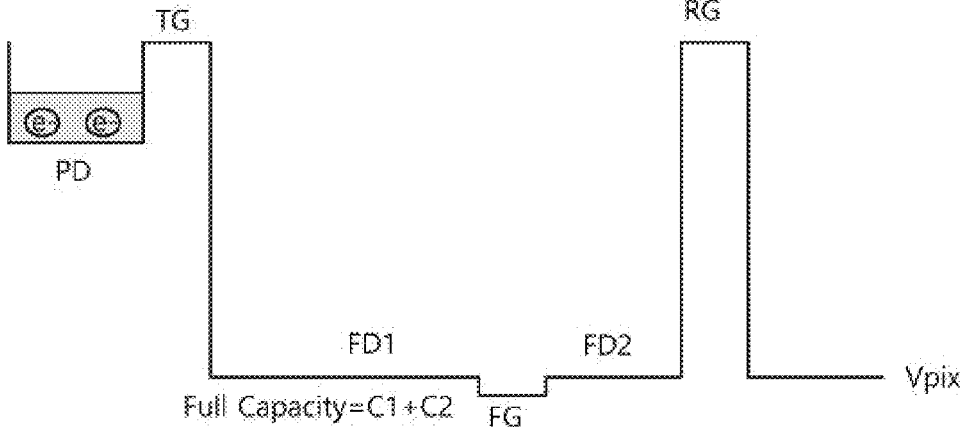
Figure 6C:
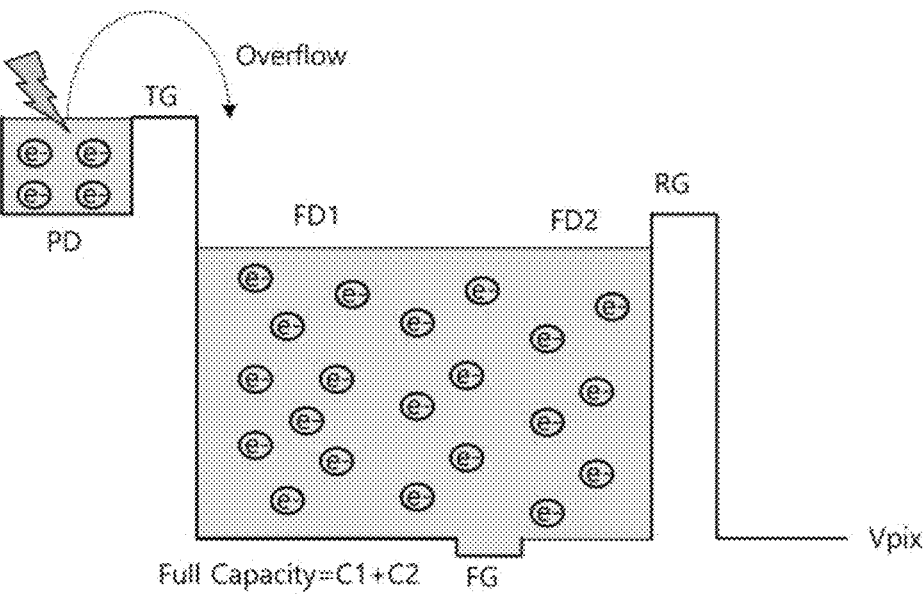

At point in time T7, a voltage level of the first and second floating diffusion regions FD1 and FD2 is sampled. As illustrated in FIG. 6C, because the full capacity is in a state of being expanded to the sum "C1+C2" of the capacities of the first and second floating diffusion regions FD1 and FD2, a large amount of charges may be contained therein.

For example, in the high-illumination mode, there may occur the over-flow that charges, the amount of which exceeds a maximum capacitance value capable of being contained in the photo diode PD, are generated and then flow over a channel potential barrier of the transfer transistor TX. Even though the overflow occurs, because the full capacity is in an expanded state, the expanded full capacity may be sufficient to receive the charges flowing over the channel potential barrier. For example, the overflowed charges may be used for the sampling operation, not discarded.

Meanwhile, the sampled voltage level of the first and second floating diffusion regions FD1 and FD2 may be defined as a second signal voltage (2nd signal voltage). A digital code may be output by comparing the second signal voltage with the second reference voltage sampled at point in time T4. As all the capacities of the first and second floating diffusion regions FD1 and FD2, the low conversion gain LCG may be provided.

At point in time T8, a negative voltage may be provided through the first boosting signal FDB1, and a positive voltage may be provided through the second boosting signal FDB2. According to the above condition, a voltage level of the source is lower than a voltage level of the drain with respect to the floating diffusion region transistor FX, and thus, the asymmetric potential structure is formed. In this case, because the floating diffusion region transistor FX is in a turn-on state, charges of the first floating diffusion region FD1 may move to the second floating diffusion region FD2.

At point in time T9, the floating control signal FG transitions to the low level. As such, the floating diffusion region transistor FX is turned off, and all charges present in the channel under the gate move only to the drain by the asymmetric potential structure.

Figure 6D:
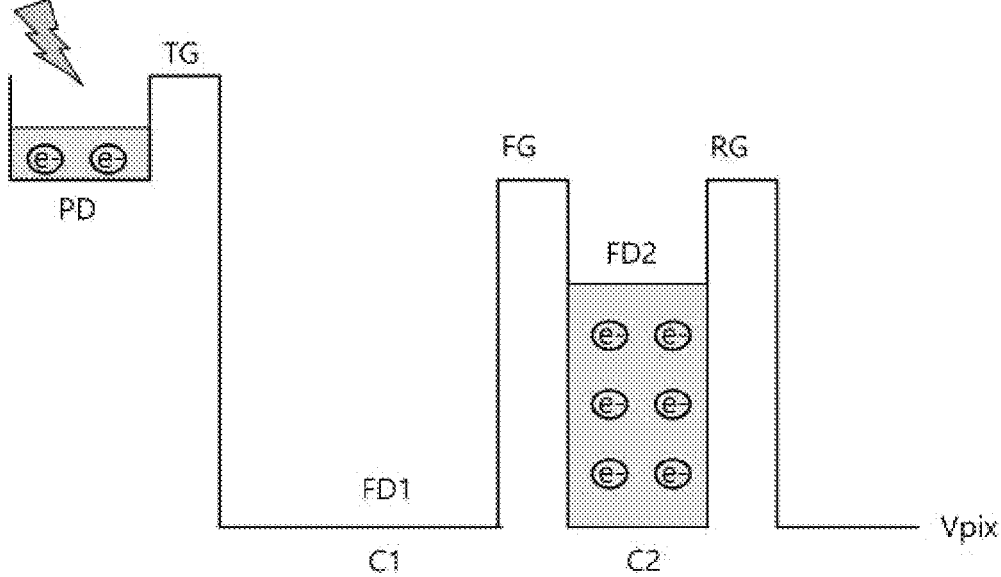

At point in time T10, a voltage level of the second floating diffusion region FD2 is sampled. As illustrated in FIG. 6D, as all the charges of the first floating diffusion region FD1 moves to the second floating diffusion region FD2, only the charges present in the second floating diffusion region FD2 are used for the sampling operation. The voltage level of the second floating diffusion region FD2 may be defined as a first signal voltage (1st signal voltage). A digital code may be output by comparing the first signal voltage with the first reference voltage sampled at point in time T2. As only the capacity C2 of the second floating diffusion region FD2 is used, the high conversion gain HCG may be provided, thus making it possible to perform the sampling operation with high sensitivity.

As described above, the unit pixel 112 according to an embodiment of the present disclosure may provide a dual conversion gain (DCG) mode in which both the high conversion gain HCG and the low conversion gain LCG are provided. In addition, the signal loss may be minimized by preventing the charge injection through the asymmetric potential structure of the floating diffusion region transistor FX.

[Image Sensor Having Additional Floating Diffusion Region Transistor]

Figure 7:
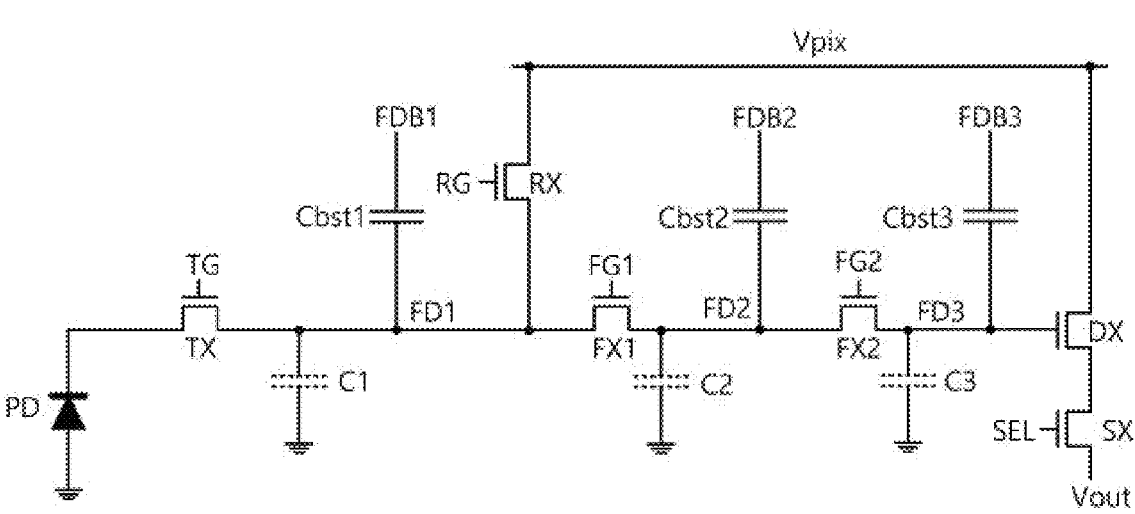
FIG. 7 is a circuit diagram illustrating a unit pixel, according to an example embodiment of the present disclosure.

FIG. 7 is a circuit diagram illustrating a unit pixel 112_1 according to an example embodiment of the present disclosure. A structure of the unit pixel 112_1 of FIG. 7 is similar to the structure of the unit pixel 112 of FIG. 2. Accordingly, the same or similar components may be marked by using the same or similar reference numerals/signs, and additional description associated with the same or similar components will be omitted to avoid redundancy.

Referring to FIG. 7, the unit pixel 112_1 may include one photo diode PD, six NMOS transistors TX, FX1, FX2, RX, DX, and SX, and three boosting capacitors Cbst1, Cbst2, and Cbst3.

Compared to the unit pixel 112 of FIG. 2, the unit pixel 112_1 of FIG. 7 further includes a third floating diffusion region FD3. In addition, the unit pixel 112_1 further include the second floating diffusion region transistor FX2 for connecting the third floating diffusion region FD3 with the second floating diffusion region FD2 and the third boosting capacitor Cbst3 for boosting a voltage level of the third floating diffusion region FD3. According to the above structure, the unit pixel 112_1 of FIG. 7 may provide a wider dynamic range.

In a first mode according to an embodiment of the present disclosure, the transfer transistor TX may be turned on in a state where both the first floating diffusion region transistor FX1 and the second floating diffusion region transistor FX2 are turned on. In this case, the first to third floating diffusion regions FD1 to FD3 may be electrically connected with each other, and charges integrated by the photo diode PD may move to the first to third floating diffusion regions FD1 to FD3.

Afterwards, a voltage level of the first to third floating diffusion regions FD1 to FD3 may be sampled. Because charges are stored in a capacity (i.e., C1+C2+C3) provided by the first to third floating diffusion regions FD1 to FD3, the relatively low conversion gain LCG may be provided.

In a second mode according to an embodiment of the present disclosure, the asymmetric potential structure may be formed with respect to the first floating diffusion region transistor FX1. For example, a negative voltage may be provided through the first boosting signal FDB1, and a positive voltage may be provided through the second boosting signal FDB2. As such, a voltage level of the first floating diffusion region FD1 may decrease, and a voltage level of the second and third floating diffusion regions FD2 and FD3 may increase. For example, the asymmetric potential structure that allows charges of the first floating diffusion region FD1 to easily move to the second and third floating diffusion regions FD2 and FD3 may be formed. Through the asymmetric potential structure, the charges of the first floating diffusion region FD1 may move to the second and third floating diffusion regions FD2 and FD3.

Afterwards, a voltage level of the second and third floating diffusion regions FD2 and FD3 may be sampled. Because charges are stored in a capacity (i.e., C2+C3) provided by the second and third floating diffusion regions FD2 and FD3, a medium conversion gain MCG may be provided.

In a third mode according to an embodiment of the present disclosure, charges belonging to the second floating diffusion region FD2 from among charges integrated in the second and third floating diffusion regions FD2 and FD3 may move to the third floating diffusion region FD3. To this end, the asymmetric potential structure may be formed with respect to the second floating diffusion region transistor FX2. For example, a negative voltage may be provided through the second boosting signal FDB2, and a positive voltage may be provided through a third boosting signal FDB3. According to the above condition, a voltage level of the second floating diffusion region FD2 may decrease, a voltage level of the third floating diffusion region FD3 may increase, and the charges of the second floating diffusion region FD2 may move to the third floating diffusion region FD3.

Afterwards, a voltage level of the third floating diffusion region FD3 may be sampled. Because the sampling operation is performed by using only charges stored in the capacity (i.e., C3) provided by the third floating diffusion region FD3, the relatively high conversion gain HCG may be provided.

As described above, the unit pixel 112_1 according to an embodiment of the present disclosure may provide the wider dynamic range by additionally including a floating diffusion region and a floating diffusion region transistor.

Figure 8:
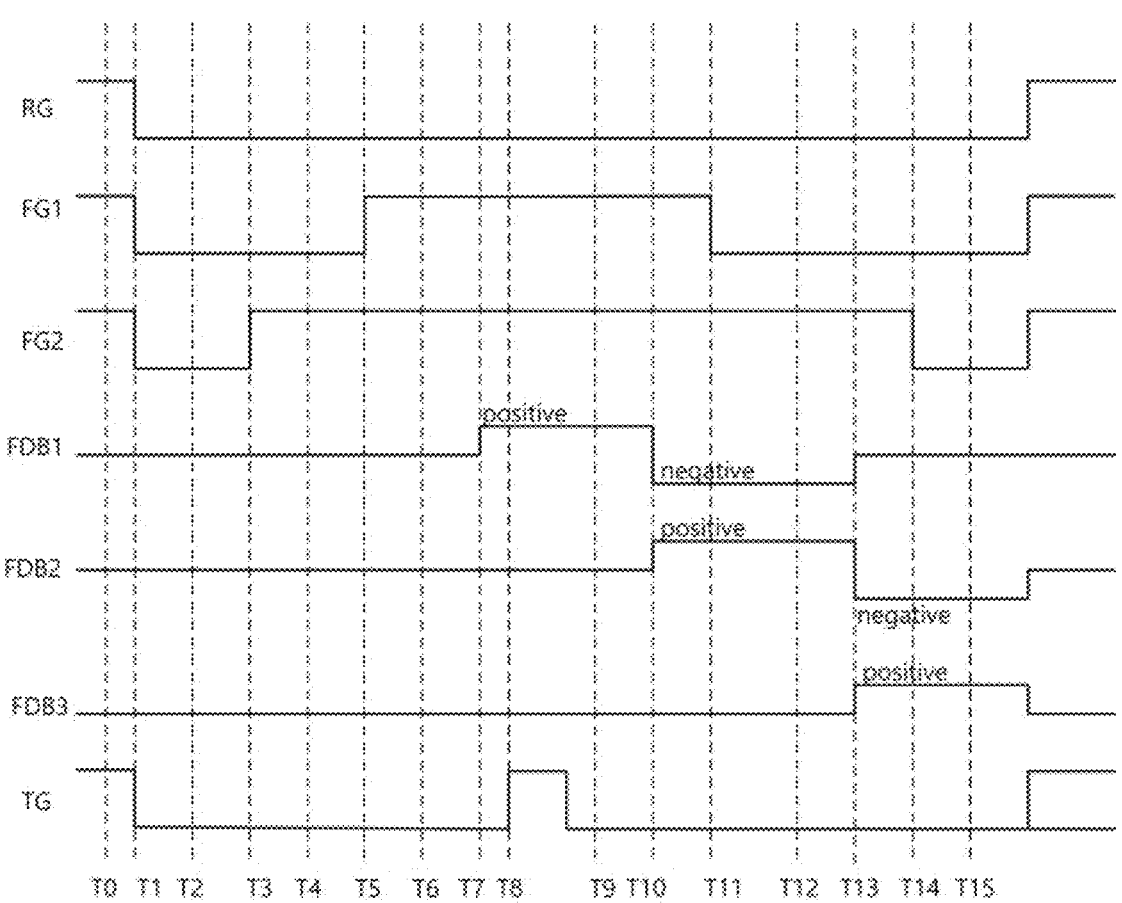
FIG. 8 is a timing diagram illustrating a method of driving a unit pixel of FIG. 7.

FIG. 8 is a timing diagram illustrating a method of driving a unit pixel of FIG. 7, and FIGS. 9A to 9C are diagrams illustrating a potential state of a unit pixel of FIG. 7.

Referring to FIG. 8, at point in time T0, the reset signal RG, the first and second floating control signals FG1 and FG2, and the transfer signal TG provided to the unit pixel 112_1 are at the high level. In this case, the reset transistor RX is turned on, and thus, the terminal for the power supply voltage Vpix is connected with the first to third floating diffusion regions FD1 to FD3, and the photo diode PD. Accordingly, the first to third floating diffusion regions FD1 to FD3 and the photo diode PD are reset to the power supply voltage Vpix.

At point in time T1, the reset signal RG, the first and second floating control signals FG1 and FG2, and the transfer signal TG transition to the low level, and thus, the reset transistor RX, the first and second floating diffusion region transistors FX1 and FX2, and the transfer transistor TX are turned off. According to the above condition, the first floating diffusion region FD1 and the second floating diffusion region FD2 are electrically disconnected from each other, and the second floating diffusion region FD2 and the third floating diffusion region FD3 are electrically disconnected from each other. As such, the first to third floating diffusion regions FD1 to FD3 are in a floating state.

At point in time T2, a voltage level of the third floating diffusion region FD3 is sampled. The voltage level of the third floating diffusion region FD3 may be defined as a third reference voltage (3rd reference voltage) and may be used as a reference voltage in the third mode.

At point in time T3, the second floating control signal FG2 transitions to the high level, and thus, the second floating diffusion region FD2 and the third floating diffusion region FD3 are electrically connected with each other.

At point in time T4, a voltage level of the second and third floating diffusion regions FD2 and FD3 that are electrically connected is sampled. The voltage level of the second and third floating diffusion regions FD2 and FD3 may be defined as a second reference voltage (2nd reference voltage) and may be used as a reference voltage in the second mode.

At point in time T5, the first floating control signal FG1 transitions to the high level, and thus, the first to third floating diffusion regions FD1 to FD3 are electrically connected with each other.

At point in time T6, a voltage level of the first to third floating diffusion regions FD1 to FD3 that are electrically connected is sampled. The voltage level of the first to third floating diffusion regions FD1 to FD3 may be defined as a first reference voltage (1st reference voltage) and may be used as a reference voltage in the first mode.

At point in time T7, a positive voltage is provided through the first boosting signal FDB1. Because the first to third floating diffusion regions FD1 to FD3 are electrically connected with each other at point in time T5, a voltage level of the first to third floating diffusion regions FD1 to FD3 increases. According to the above description, there is formed the asymmetric potential structure that allows charges of the photo diode PD to easily move.

At point in time T8, the transfer signal TG transitions to the high level. As such, charges integrated by the photo diode PD move to the first to third floating diffusion regions FD1 to FD3.

Figure 9A:
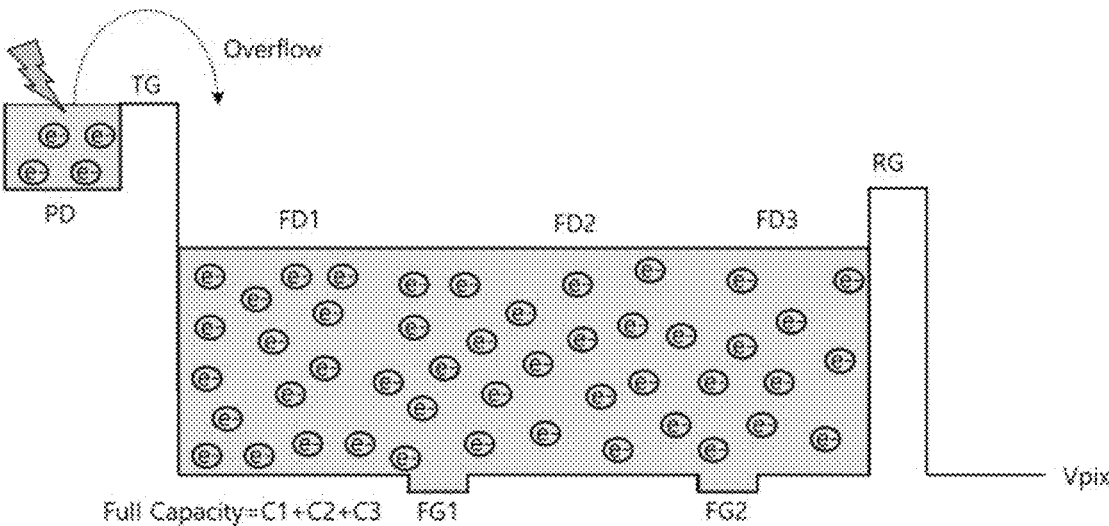
FIGS. 9A to 9C are diagrams illustrating a potential state of a unit pixel of FIG. 7.

At point in time T9, a voltage level of the first to third floating diffusion regions FD1 to FD3 is sampled. As illustrated in FIG. 9A, the full capacity corresponds to a sum (i.e., "C1+C2+C3") of the capacities of the first to third floating diffusion regions FD1 to FD3, and thus, a large amount of charges may be contained therein. For example, even though there are generated charges, the amount of which exceeds a maximum capacitance value capable of being contained in the photo diode PD, the full capacity (i.e., "C1+C2+C3") may receive all the overflowed charges without the loss. The voltage level of the first to third floating diffusion regions FD1 to FD3 may be defined as a first signal voltage (1st signal voltage), and may be compared with the first reference voltage sampled at point in time T6 such that a digital code is output. In the first mode where all the capacities of the first to third floating diffusion regions FD1 to FD3 are used, the low conversion gain LCG may be provided.

At point in time T10, a negative voltage may be provided through the first boosting signal FDB1, and a positive voltage may be provided through the second boosting signal FDB2. According to the above condition, the asymmetric potential structure in which a voltage level of the source is lower than a voltage level of the drain is formed with respect to the first floating diffusion region transistor FX1. Also, because the first floating diffusion region transistor FX1 is in a turn-on state, charges of the first floating diffusion region FD1 move to the second and third floating diffusion regions FD2 and FD3.

At point in time T11, the first floating control signal FG1 transitions to the low level, and thus, the first floating diffusion region transistor FX1 is turned off, and all charges present in the channel under the gate move to the drain by the asymmetric potential structure.

Figure 9B:
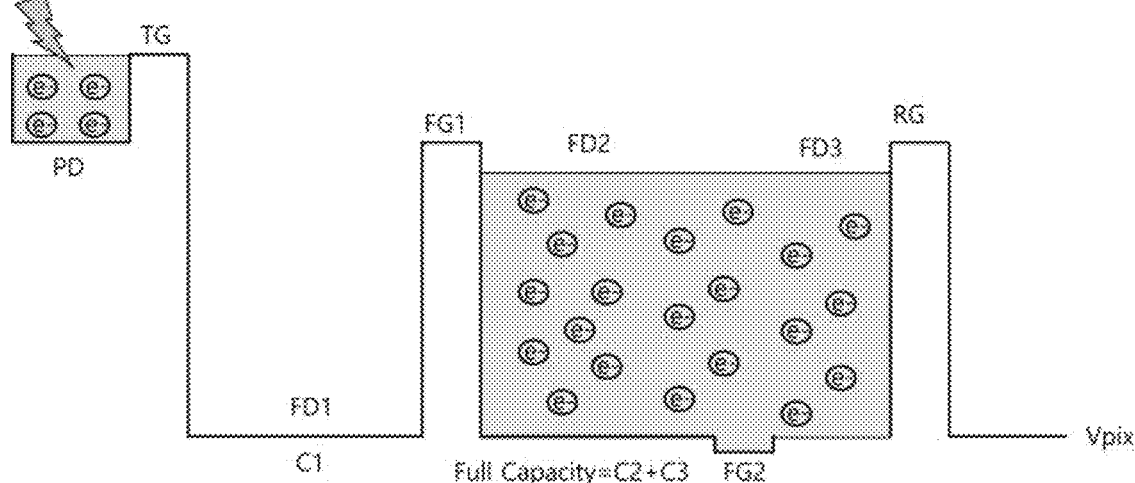

At point in time T12, a voltage level of the second and third floating diffusion regions FD2 and FD3 is sampled. As illustrated in FIG. 9B, the full capacity corresponds to a sum (i.e., "C2+C3") of the capacities of the second and third floating diffusion regions FD2 and FD3. The voltage level of the second and third floating diffusion regions FD2 and FD3 may be defined as a second signal voltage (2nd signal voltage), and may be compared with the second reference voltage sampled at point in time T4 such that a digital code is output. In the second mode where the capacities of the second and third floating diffusion regions FD2 and FD3 are used, the medium conversion gain MCG may be provided.

At point in time T13, a negative voltage may be provided through the second boosting signal FDB2, and a positive voltage may be provided through the third boosting signal FDB3. According to the above condition, the asymmetric potential structure in which a voltage level of the source is lower than a voltage level of the drain is formed with respect to the second floating diffusion region transistor FX2, and charges move to the third floating diffusion region FD3.

At point in time T14, the second floating control signal FG2 transitions to the low level, and thus, the second floating diffusion region transistor FX2 is turned off, and all charges present in the channel under the gate move to the drain by the asymmetric potential structure.

Figure 9C:
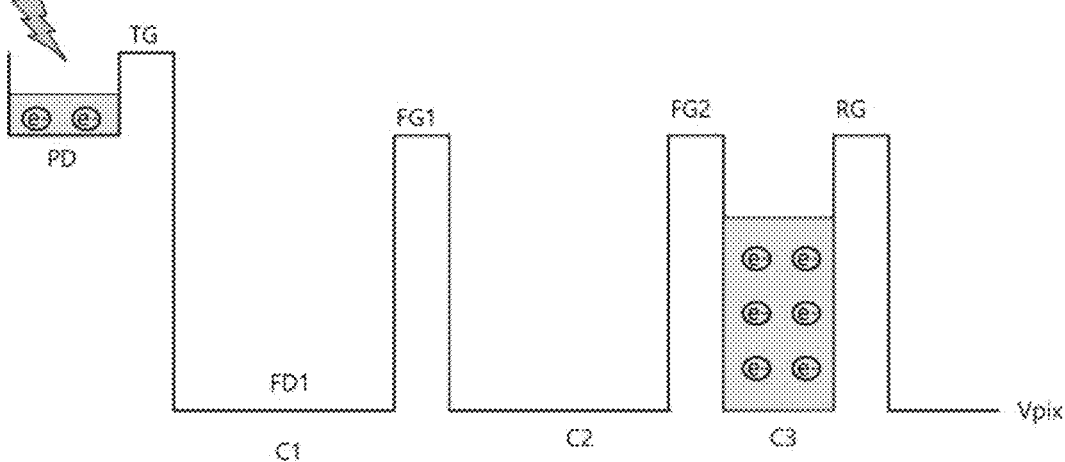

At point in time T15, a voltage level of the third floating diffusion region FD3 is sampled. As illustrated in FIG. 9C, in the third mode, because all charges are stored in the third floating diffusion region FD3, the high conversion gain HCG may be provided, that is, it may be possible to perform the sampling operation with high sensitivity. The voltage level of the third floating diffusion region FD3 may be defined as a third signal voltage (3rd signal voltage), and may be compared with the third reference voltage sampled at point in time T2 such that a digital code is output.

As described above, the unit pixel 112_1 according to an embodiment of the present disclosure may provide the wider dynamic range by additionally including a floating diffusion region and a floating diffusion region transistor.

[Image Sensor with Floating Diffusion Region Sharing Structure]

Figure 10:
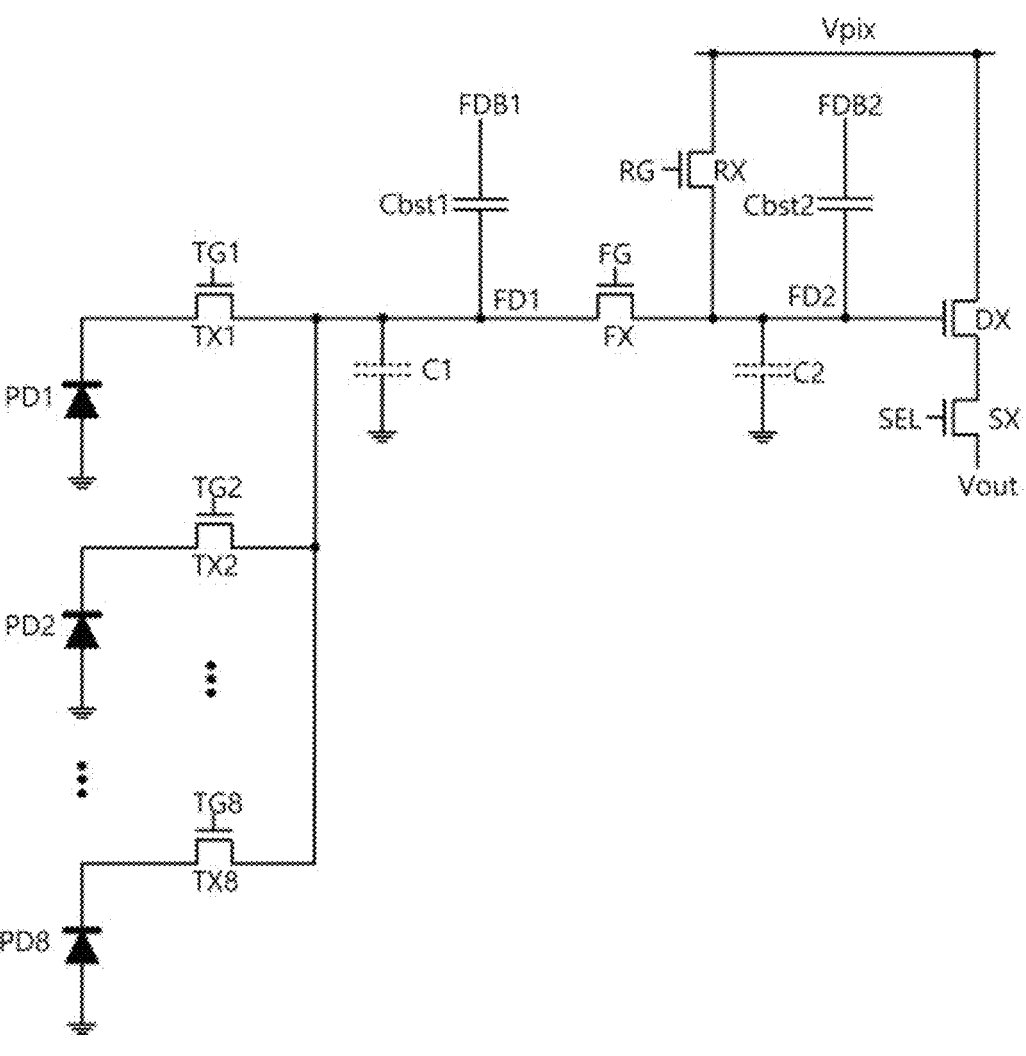
FIG. 10 is a circuit diagram illustrating a unit pixel, according to an example embodiment of the present disclosure.

FIG. 10 is a circuit diagram illustrating a unit pixel 112_2 according to an example embodiment of the present disclosure. A structure of the unit pixel 112_2 of FIG. 10 is similar to the structure of the unit pixel 112 of FIG. 2. Accordingly, the same or similar components may be marked by using the same or similar reference numerals/signs, and additional description associated with the same or similar components will be omitted to avoid redundancy.

Referring to FIG. 10, the unit pixel 112_2 may include a plurality of photo diodes PD1 to PD8, a plurality of NMOS transistors TX1 to TX8, FX, RX, DX, and SX, and two boosting capacitors Cbst1 and Cbst2.

Compared to the unit pixel 112 of FIG. 2, the unit pixel 112_2 of FIG. 10 has a structure in which a plurality of photo diodes share the same floating diffusion region. In an embodiment, an example in which 8 photo diodes PD1 to PD8 share a floating diffusion region is illustrated in FIG. 10.

In the case of a conventional floating diffusion region sharing structure, a plurality of photo diodes are connected with the same floating diffusion region through corresponding transfer transistors. For example, one end of a floating diffusion region is connected with drains of the plurality transfer transistors TX, an opposite end thereof is connected with the gate of the drive transistor DX. In this case, a parasitic capacitor may be formed between the gates of the plurality of transfer transistors TX and the floating diffusion region. As the number of photo diodes sharing a floating diffusion region increases, a capacity of the parasitic capacitor becomes greater, which acts as an obstacle in performing the high conversion gain HCG and high-sensitivity sampling.

To minimize a noise due to the parasitic capacitor, the unit pixel 112_2 according to an embodiment of the present disclosure may completely separate a floating diffusion region targeted for sampling from transfer transistors. To this end, the unit pixel 112_2 according to an embodiment of the present disclosure may have a structure that includes the first and second floating diffusion regions FD1 and FD2 physically spaced apart from each other and the floating diffusion region transistor FX interposed therebetween. The first floating diffusion region FD1 may be connected with the plurality of transfer transistors TX1 to TX8, and the second floating diffusion region FD2 may be connected with the drive transistor DX.

As will be described below, the unit pixel 112_2 performs the sampling operation only on the second floating diffusion region FD2 after all charges integrated in the first floating diffusion region FD1 move to the second floating diffusion region FD2. Because the sampling operation is performed after the first floating diffusion region FD1 is separated from the second floating diffusion region FD2 through the floating diffusion region transistor FX, a noise due to the parasitic capacitor between the first floating diffusion region FD1 and the gates of the transfer transistors TX1 to TX8 may be minimized. In addition, as described above, charges present in the channel under the gate may move to the second floating diffusion region FD2 through the asymmetric potential structure implemented by the floating diffusion region transistor FX, without the loss. As a result, the unit pixel 112_2 according to an embodiment of the present disclosure may allow charges generated by the photo diodes PD1 to PD8 to move to a node, at which the sensing operation is performed, without the loss, and thus may provide the high-sensitivity sensing operation with the high conversion gain HCG.

Figure 11:
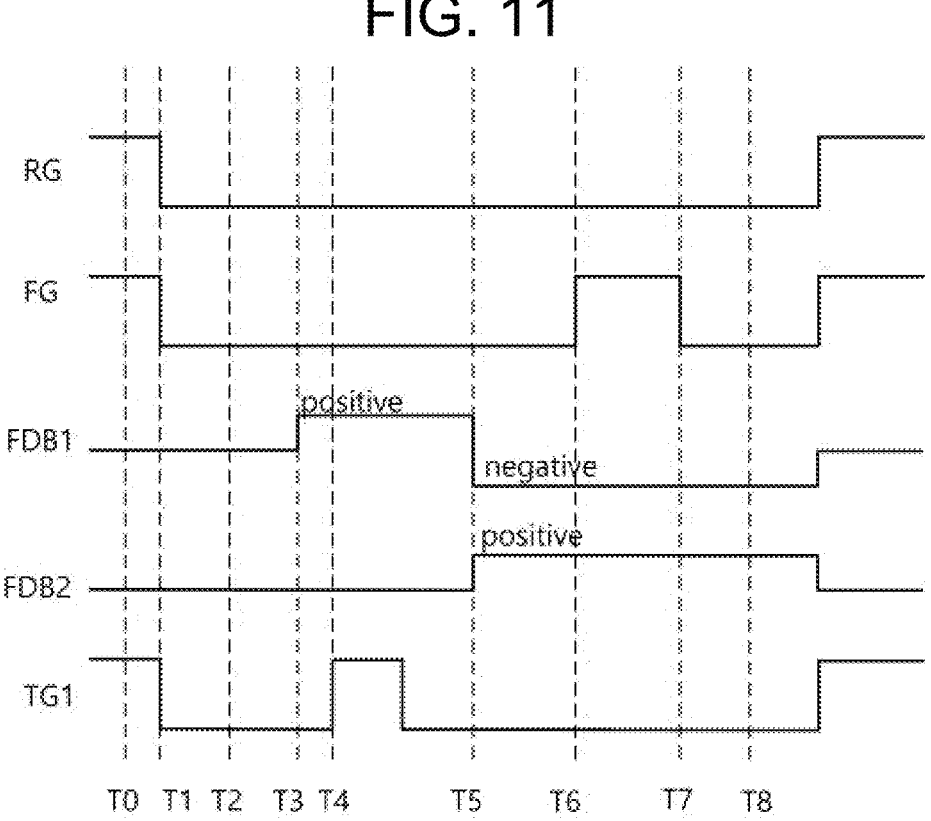
FIG. 11 is a timing diagram illustrating a method of driving a unit pixel of FIG. 10.

FIG. 11 is a timing diagram illustrating a method of driving a unit pixel of FIG. 10. For convenience, a method of driving a unit pixel will be described based on the first photo diode PD1 as an example.

At point in time T0, the first floating diffusion region FD1, the second floating diffusion region FD2, and the photo diodes PD1 to PD8 are reset with a power supply voltage Vpix.

At point in time T1, the reset transistor RX, the floating diffusion region transistor FX, and the transfer transistor TX1 are turned off, and the first floating diffusion region FD1 and second floating diffusion region FD2 are electrically separated from each other and are floated.

At point in time T2, a voltage level of the second floating diffusion region FD2 is sampled. The voltage level of the second floating diffusion region FD2 may be defined as a reference voltage.

At point in time T3, a positive voltage is provided through the first boosting signal FDB1. As such, a voltage level of the first floating diffusion region FD1 increases, and the asymmetric potential structure that allows charges integrated in the photo diode PD1 to easily move to the first floating diffusion region FD1 is formed.

At point in time T4, the transfer signal TG1 transitions to the high level, and the charges integrated by the photo diode PD1 move to the first floating diffusion region FD1.

At point in time T5, a negative voltage may be provided through the first boosting signal FDB1, and a positive voltage may be provided through the second boosting signal FDB2. As such, the asymmetric potential structure is formed with respect to the floating diffusion region transistor FX.

At point in time T6, as the floating control signal FG transitions to the high level, the floating diffusion region transistor FX is turned on. In this case, the charges integrated in the first floating diffusion region FD1 move to the second floating diffusion region FD2.

At point in time T7, as the floating control signal FG transitions to the low level, the floating diffusion region transistor FX is turned off. In this case, all charges present in the channel under the gate move to the drain by the asymmetric potential structure.

At point in time T8, a voltage level of the second floating diffusion region FD2 is sampled. In this case, because the floating diffusion region transistor FX is in a turn-off state, the second floating diffusion region FD2 is physically separated from the first floating diffusion region FD1. Accordingly, the sampling operation may be performed in a state where the influence of the parasitic capacitor between the first floating diffusion region FD1 and the gates of the transfer transistors TX1 to TX8 is minimized. The voltage level of the second floating diffusion region FD2 may be defined as a signal voltage, and may be compared with the reference voltage such that a digital code is output.

As described above, the unit pixel 112_2 according to an embodiment of the present disclosure may perform the sampling operation in a state where the influence of a noise due to the parasitic capacitor between the first floating diffusion region FD1 and the gates of the transfer transistors TX1 to TX8 is minimized. In addition, charges may move to a node, at which the sensing operation is performed, through the asymmetric potential structure without the loss, and thus, high-sensitivity sampling with the high conversion gain HCG may be provided.

[Image Sensor with Floating Diffusion Region Sharing Structure Supporting Dual Conversion Gain Mode]

Figure 12:
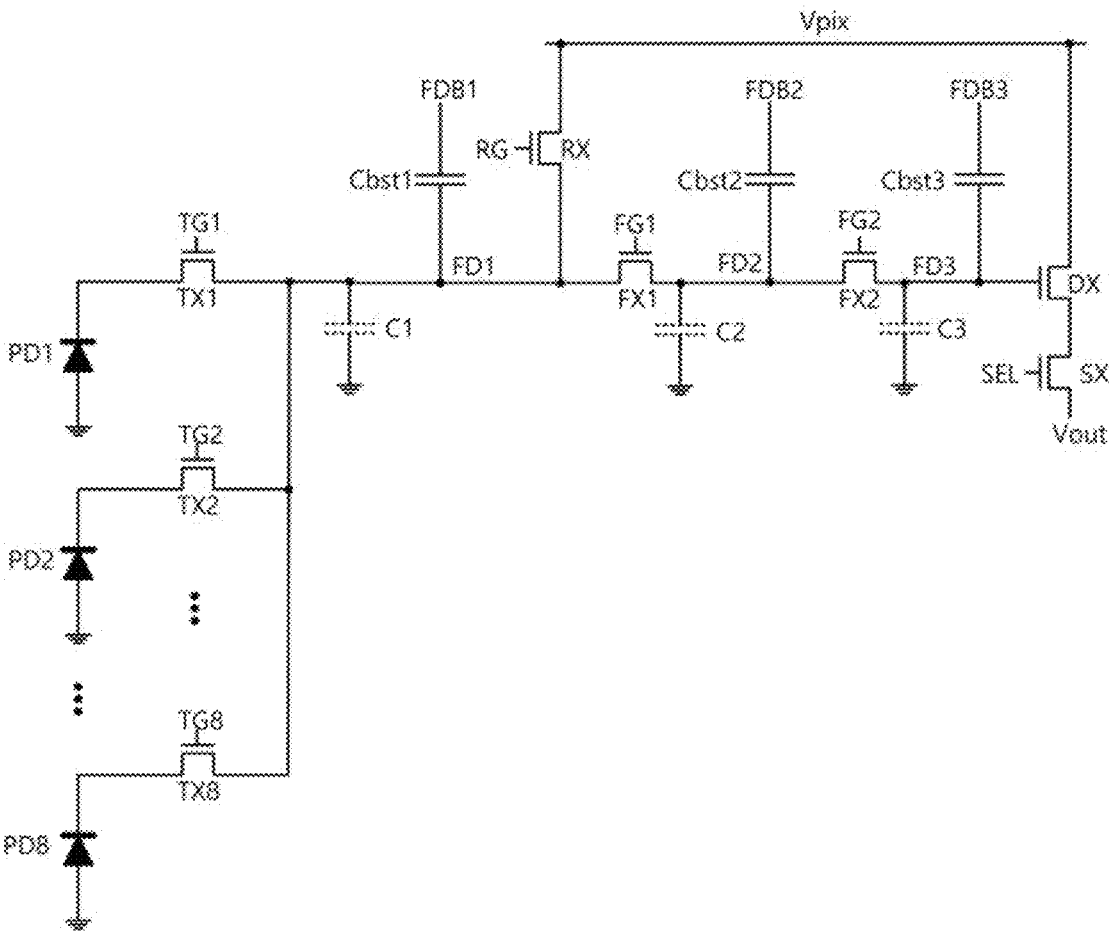
FIG. 12 is a circuit diagram illustrating a unit pixel, according to an example embodiment of the present disclosure.

FIG. 12 is a circuit diagram illustrating a unit pixel 112_3 according to an example embodiment of the present disclosure. A structure of the unit pixel 112_3 of FIG. 12 is similar to the structure of the unit pixel 112_2 of FIG. 10. Accordingly, the same or similar components may be marked by using the same or similar reference numerals/signs, and additional description associated with the same or similar components will be omitted to avoid redundancy.

Referring to FIG. 12, the unit pixel 112_3 may include the plurality of photo diodes PD1 to PDB, a plurality of NMOS transistors TX1 to TX8, FX1, FX2, RX, DX, and SX, the plurality of boosting capacitors Cbst1, Cbst2, and Cbst3.

Compared to the unit pixel 112_2 of FIG. 10, the unit pixel 112_3 of FIG. 12 further includes the third floating diffusion region FD3, the second floating diffusion region transistor FX2 for connecting the third floating diffusion region FD3 with the second floating diffusion region FD2, and the third boosting capacitor Cbst3 for boosting a voltage level of the third floating diffusion region FD3. Through the above structure, the unit pixel 112_3 of FIG. 12 may provide the dual conversion gain mode in which the high conversion gain HCG and the low conversion gain LCG are provided.

Figure 13:
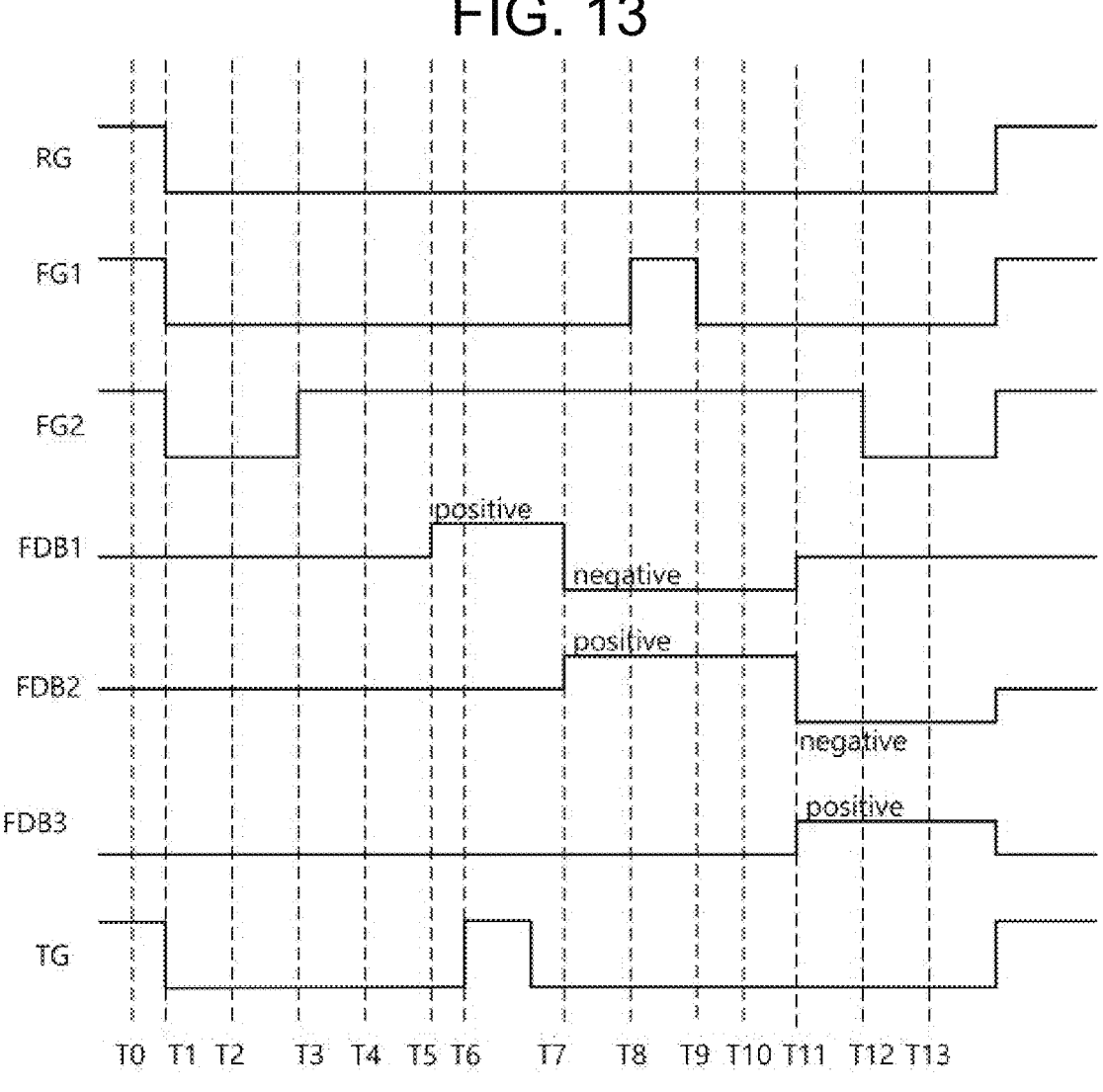
FIG. 13 is a timing diagram illustrating a method of driving a unit pixel of FIG. 12.

FIG. 13 is a timing diagram illustrating a method of driving a unit pixel of FIG. 12, and FIGS. 14A to 14C are diagrams illustrating a potential state of a unit pixel of FIG. 12.

For convenience, the method of driving a unit pixel of FIG. 12 will be described based on one photo diode PD. Referring to FIG. 13, at point in time T0, the first to third floating diffusion regions FD1 to FD3 and the photo diode PD are reset to the power supply voltage Vpix.

At point in time T1, the reset transistor RX, the first and second floating diffusion region transistors FX1 and FX2, and the transfer transistor TX are turned off. As such, the first to third floating diffusion regions FD1 to FD3 are floated.

At point in time T2, a voltage level of the third floating diffusion region FD3 is sampled. The voltage level of the third floating diffusion region FD3 may be defined as a first reference voltage (1st reference voltage) and may be used as a reference voltage in the low-illuminance mode.

At point in time T3, the second floating control signal FG2 transitions to the high level, and thus, the second floating diffusion region FD2 and the third floating diffusion region FD3 are electrically connected with each other.

At point in time T4, a voltage level of the second and third floating diffusion regions FD2 and FD3 that are electrically connected is sampled. The voltage level of the second and third floating diffusion regions FD2 and FD3 may be defined as a second reference voltage (2nd reference voltage) and may be used as a reference voltage in the high-illumination mode.

At point in time T5, a positive voltage is provided through the first boosting signal FDB1, and thus, a voltage level of the first floating diffusion region FD1 may increase. According to the above description, there is formed the asymmetric potential structure that allows charges of the photo diode PD to easily move to the first floating diffusion region FD1.

Figure 14A:
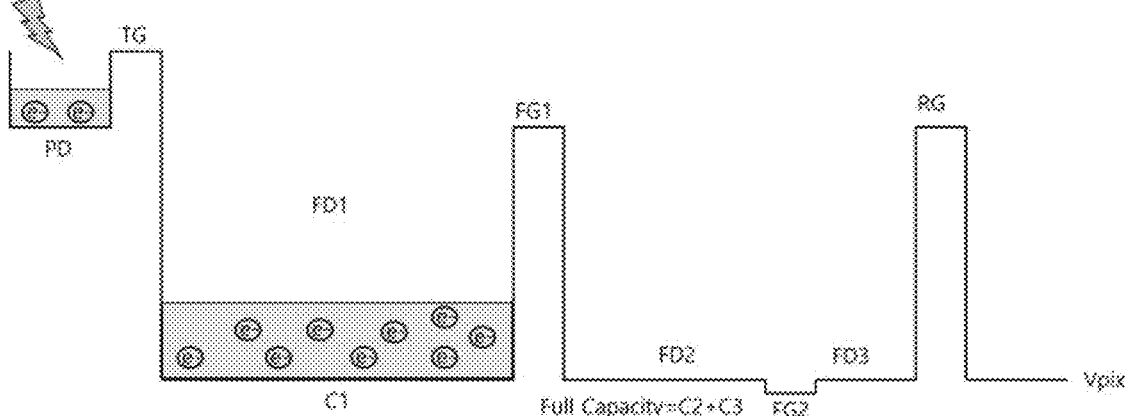
FIGS. 14A to 14C are diagrams illustrating a potential state of a unit pixel of FIG. 12.

At point in time T6, the transfer signal TG transitions to the high level, and the charges integrated by the photo diode PD1 move to the first floating diffusion region FD1. In this case, because the first floating diffusion region transistor FX1 is in a turn-off state, as illustrated in FIG. 14A, the charges generated by the photo diode PD are integrated only in the first floating diffusion region FD1.

At point in time T7, a negative voltage may be provided through the first boosting signal FDB1, and a positive voltage may be provided through the second boosting signal FDB2. As such, the asymmetric potential structure is formed with respect to the first floating diffusion region transistor FX1.

At point in time T8, as the first floating control signal FG1 transitions to the high level, the first floating diffusion region transistor FX1 is turned on. In this case, the charges of the first floating diffusion region FD1 move to the second and third floating diffusion regions FD2 and FD3.

At point in time T9, as the first floating control signal FG1 transitions to the low level, the first floating diffusion region transistor FX1 is turned off. According to the above condition, all charges present in the channel under the gate move to the drain by the asymmetric potential structure.

Figure 14B:
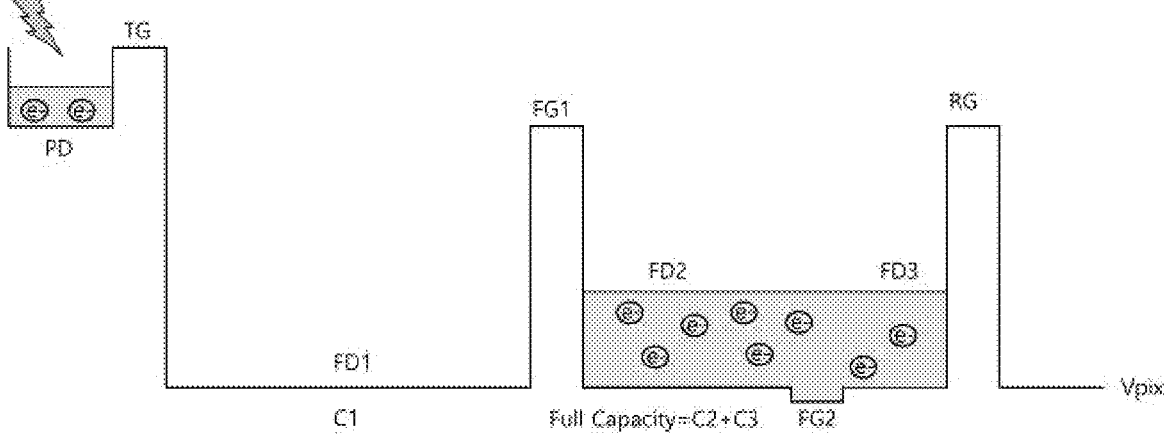

At point in time T10, a voltage level of the second and third floating diffusion regions FD2 and FD3 is sampled. As illustrated in FIG. 14B, the full capacity corresponds to a sum "C2+C3" of the capacities of the second and third floating diffusion regions FD2 and FD3. The voltage level of the second and third floating diffusion regions FD2 and FD3 may be defined as a second signal voltage (2nd signal voltage), and may be compared with the second reference voltage such that a digital code is output. In the high-illumination mode where the capacities of the second and third floating diffusion regions FD2 and FD3 are used, the low conversion gain LCG may be provided.

At point in time T11, a negative voltage may be provided through the second boosting signal FDB2, and a positive voltage may be provided through the third boosting signal FDB3. According to the above condition, the asymmetric potential structure in which a voltage level of the source is lower than a voltage level of the drain is formed with respect to the second floating diffusion region transistor FX2, and charges move to the third floating diffusion region FD3.

At point in time T12, as the second floating control signal FG2 transitions to the low level, the second floating diffusion region transistor FX2 is turned off. According to the above condition, all charges present in the channel under the gate move to the drain by the asymmetric potential structure.

Figure 14C:
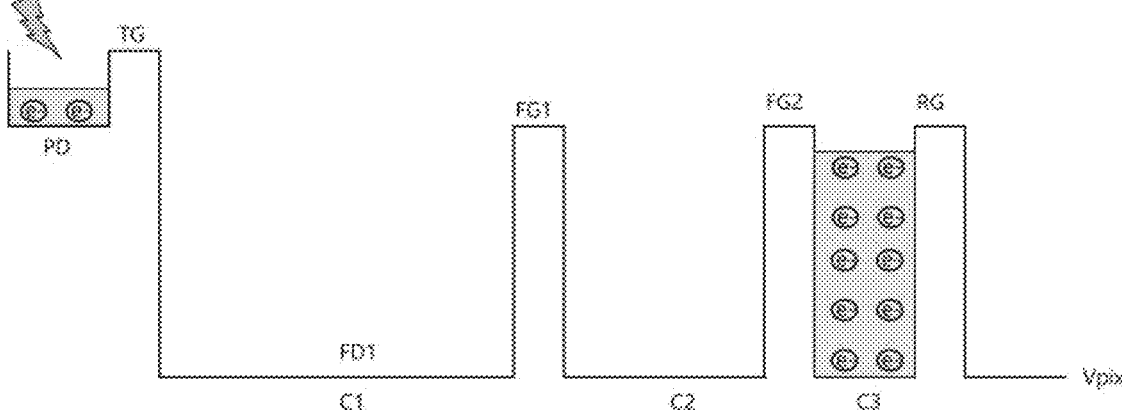

At point in time T13, a voltage level of the third floating diffusion region FD3 is sampled. As illustrated in FIG. 14C, in the low-illuminance mode, because all charges are stored in the third floating diffusion region FD3, the high conversion gain HCG may be provided, that is, it may be possible to perform the sampling operation with high sensitivity. The voltage level of the third floating diffusion region FD3 may be defined as a first signal voltage (1st signal voltage), and may be compared with the first reference voltage such that a digital code is output.

As described above, the unit pixel 112_3 according to an embodiment of the present disclosure may provide the dual conversion gain mode in which the high conversion gain HCG and the low conversion gain LCG are provided. In addition, the noise due to the parasitic capacitor between the first floating diffusion region FD1 and the gates of the transfer transistors TX1 to TX8 and the signal loss due to charge injection may be minimized.

Meanwhile, the above description is provided as an example, and the present disclosure is not limited thereto. Below, various modified embodiments of the invention will be described in detail.

[Image Sensor Configurable to Include Three or More Floating Diffusion Region Transistors]

Figure 15:
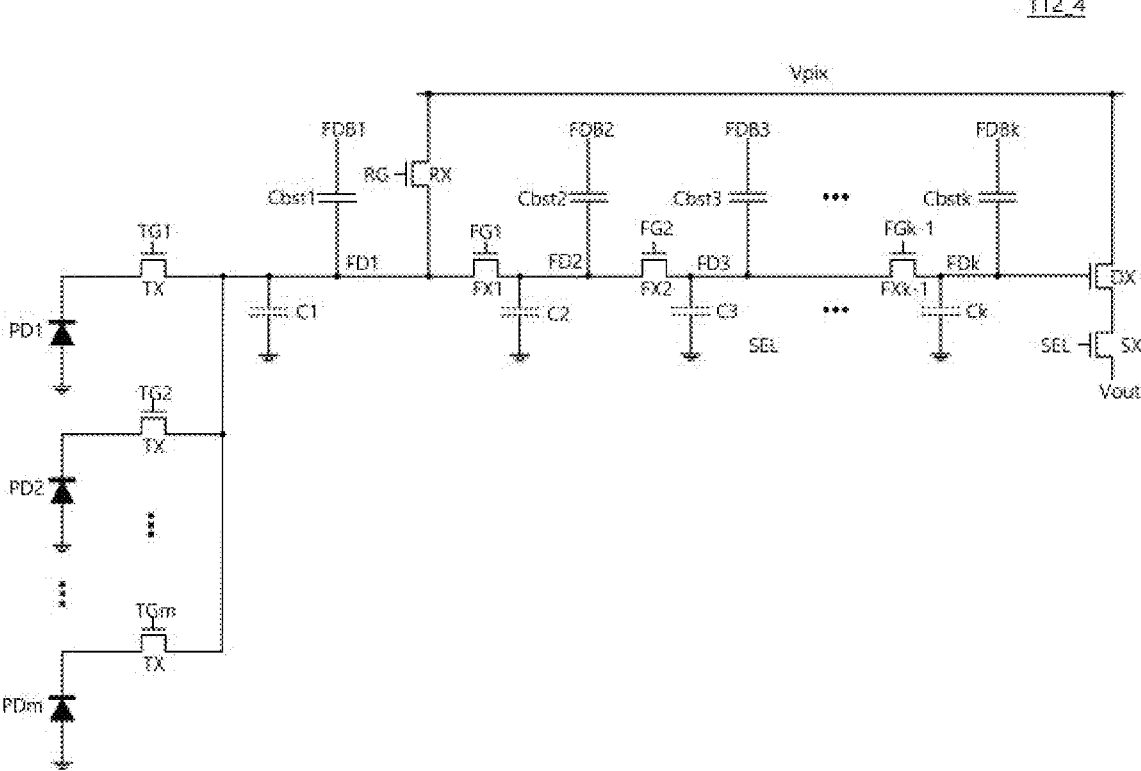
FIG. 15 is a circuit diagram illustrating a unit pixel, according to an example embodiment of the present disclosure.

FIG. 15 is a circuit diagram illustrating a unit pixel 112_4 according to an example embodiment of the present disclosure. A structure of the unit pixel 112_4 of FIG. 15 is similar to the structure of the unit pixel 112_3 of FIG. 12. Accordingly, the same or similar components may be marked by using the same or similar reference numerals/signs, and additional description associated with the same or similar components will be omitted to avoid redundancy.

An example in which the unit pixel 112_3 with the floating diffusion region sharing structure includes two floating diffusion region transistors FX1 and FX2 is illustrated in FIG. 12 and the description is given based on the example. However, this is provided as an example, and the present disclosure is not limited thereto. For example, as illustrated in FIG. 15, (k−1) floating diffusion region transistors may be provided; in this case, "k" floating diffusion regions may be implemented.

As described above, as the number of floating diffusion region transistors and the number of floating diffusion regions increase, the number of full capacities of floating diffusion regions to be sampled may also increase. For example, in the case where three floating diffusion region transistors and four floating diffusion regions are provided, a floating diffusion region may have three full capacities "C2+C3+C4", "C3+C4", and C4 that are targeted for sampling. Accordingly, as the number of floating diffusion region transistors and the number of floating diffusion regions increase, a dynamic range may become wider.

[Image Sensor Capable of Adjusting Number of Boosting Capacitors]

Meanwhile, examples in which each of the unit pixels described above includes at least two boosting capacitors are illustrated, and the description is given based on the examples. However, this is provided as an example, and the number of boosting capacitors may be adjusted depending on a designer.

Figure 16:
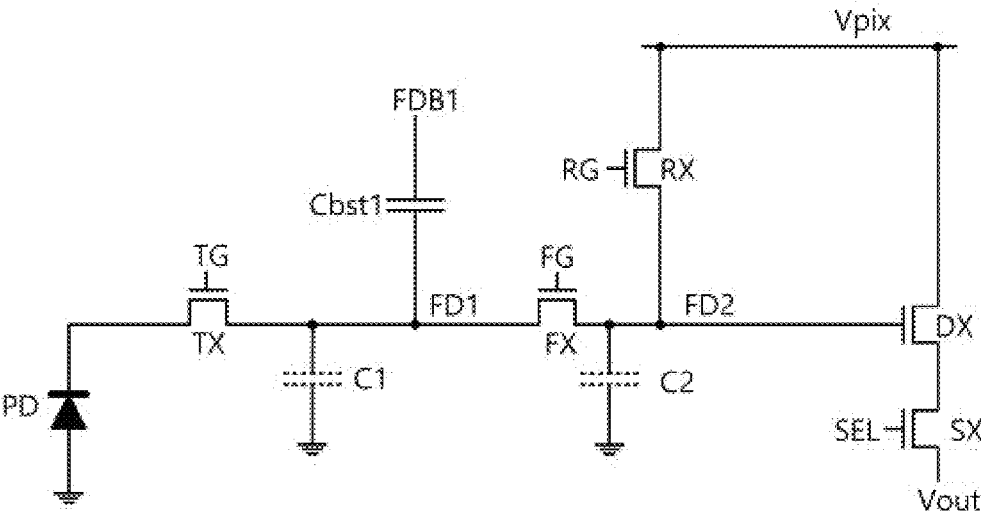
FIG. 16 is a circuit diagram illustrating a unit pixel, according to an example embodiment of the present disclosure.

FIG. 16 is a circuit diagram illustrating a unit pixel 112_5 according to an example embodiment of the present disclosure. A structure of the unit pixel 112_5 of FIG. 16 is similar to the structure of the unit pixel 112 of FIG. 2. However, unlike the unit pixel 112 of FIG. 2, the unit pixel 112_5 of FIG. 16 does not include the second boosting capacitor Cbst2. For example, the unit pixel 112_5 of FIG. 16 may form the asymmetric potential structure by using one boosting capacitor (e.g., boosting capacitor Cbst1).

For example, a positive voltage may be provided through the first boosting signal FDB1 to form the asymmetric potential structure with respect to the transfer transistor TX. And a negative voltage may be provided through the first boosting signal FDB1 to form the asymmetric potential structure with respect to the floating diffusion region transistor FX. According to the above driving scheme, the unit pixel 112_5 of FIG. 16 may be driven to be similar to the unit pixel 112 of FIG. 2, without the second boosting capacitor Cbst2. In addition, because the second boosting capacitor Cbst2 is not formed, the area necessary to implement the unit pixel 112_5 of FIG. 16 may decrease.

Figure 17:
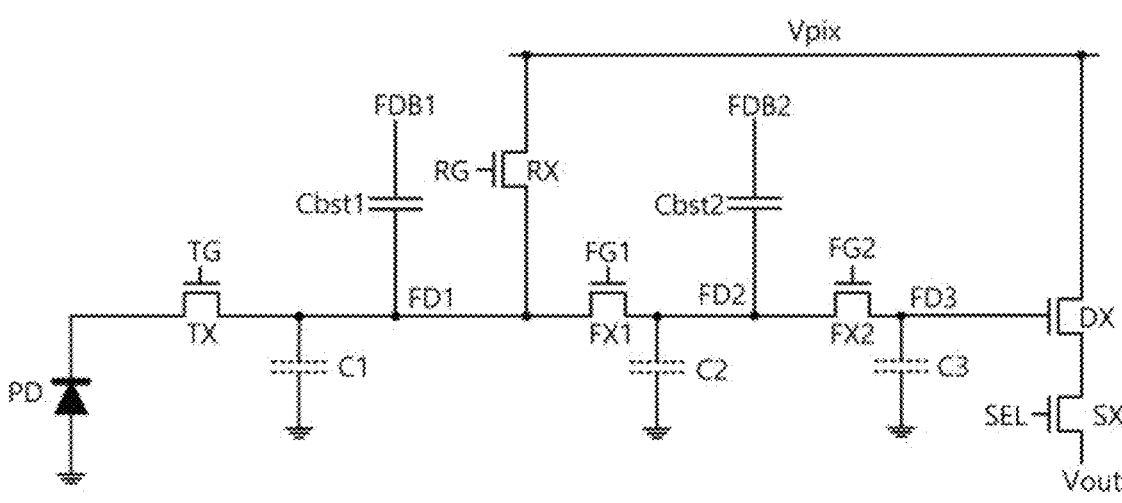
FIGS. 17 and 18 are circuit diagrams illustrating unit pixels, according to an example embodiment of the present disclosure.
Figure 18:
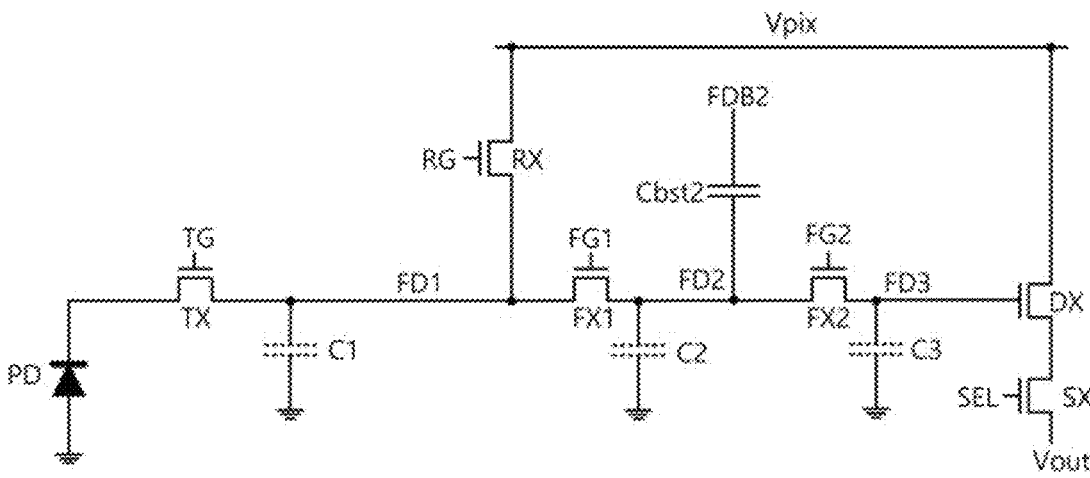

FIGS. 17 and 18 are circuit diagrams illustrating unit pixels according to an example embodiment of the present disclosure. Structures of unit pixels 112_6 and 112_7 of FIGS. 17 and 18 are similar to the structure of the unit pixel 112_1 of FIG. 7. However, the unit pixel 112_1 of FIG. 7 includes three boosting capacitors Cbst1, Cbst2, and Cbst3, while each of the unit pixels 112_6 and 112_7 of FIGS. 17 and 18 includes only one or two boosting capacitors.

Referring to FIG. 17, the unit pixel 112_6 does not include the third boosting capacitor Cbst3. Even though the unit pixel 112_6 of FIG. 17 does not include the third boosting capacitor Cbst3, the unit pixel 112_6 of FIG. 17 may form the asymmetric potential structure like the unit pixel 112_1 of FIG. 7.

For example, a positive voltage may be provided through the first boosting signal FDB1 to form the asymmetric potential structure with respect to the transfer transistor TX. Also, the asymmetric potential structure may be formed with respect to the first floating diffusion region transistor FX1 by providing a negative voltage through the first boosting signal FDB1 and providing a positive voltage through the second boosting signal FDB2. In addition, a negative voltage may be provided through the second boosting signal FDB2 to form the asymmetric potential structure with respect to the second floating diffusion region transistor FX2.

Referring to FIG. 18, the unit pixel 112_7 does not include the first and third boosting capacitor capacitors Cbst1 and Cbst3. In this case, the unit pixel 112_7 may form the asymmetric potential structure with respect to the first or second floating diffusion region transistor FX1 or FX2.

For example, a positive voltage may be provided through the second boosting signal FDB2 to form the asymmetric potential structure with respect to the first floating diffusion region transistor FX1. In addition, a negative voltage may be provided through the second boosting signal FDB2 to form the asymmetric potential structure with respect to the second floating diffusion region transistor FX2.

As described above, even though one or two boosting capacitors are provided, the unit pixels 112_6 and 112_7 of FIGS. 17 and 18 may be driven to be similar to the unit pixel 112_1 of FIG. 7. In addition, because the number of boosting capacitors decreases, the area necessary to implement the unit pixels 112_6 and/or 112_7 may decrease.

[Image Sensor with Independent Power Supply Voltage Terminal]

Meanwhile, examples in which each of the unit pixels described above forms the asymmetric potential structure by using one boosting capacitor or two or more boosting capacitors are illustrated, and the description is given based on the examples. However, this is provided as an example, and the asymmetric potential structure may be formed in various schemes, instead of a boosting capacitor. For example, as will be described below, the asymmetric potential structure may be formed by implementing different power supply voltage terminals and providing different power supply voltages to the different power supply voltage terminals.

Figure 19:
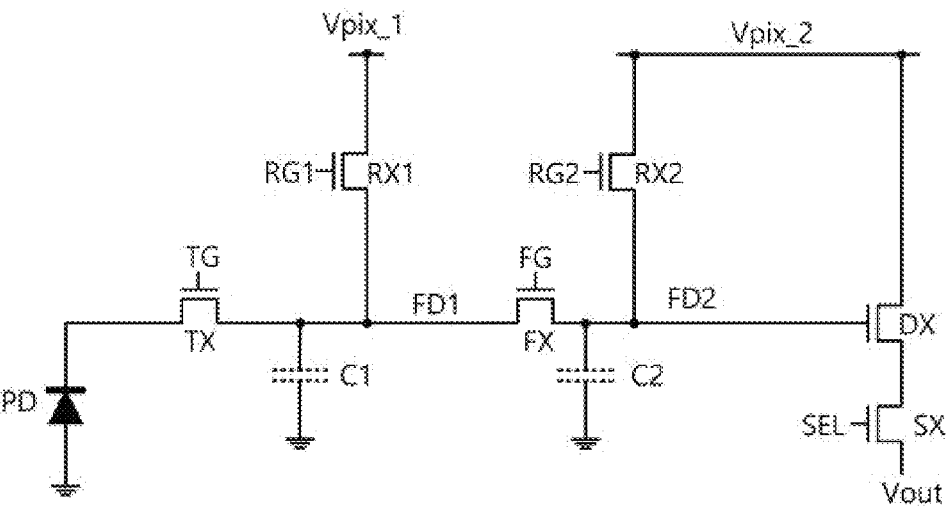
FIG. 19 is a circuit diagram illustrating a unit pixel, according to an example embodiment of the present disclosure.
Figures 20, 21:
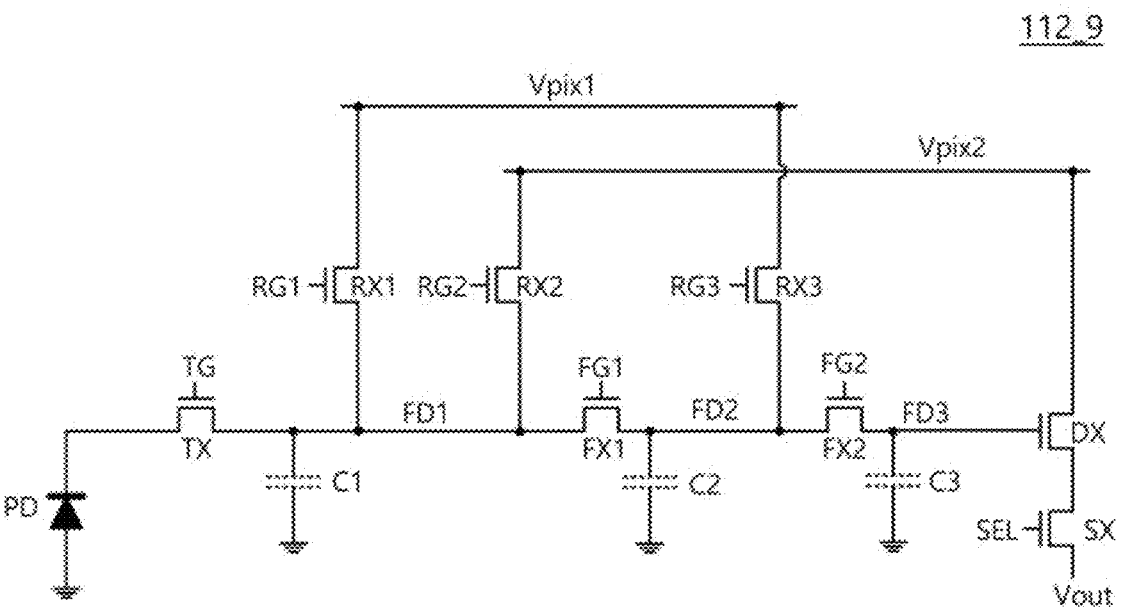
FIG. 20 is a timing diagram illustrating a method of driving a unit pixel of FIG. 19.
FIG. 21 is a circuit diagram illustrating a unit pixel, according to an example embodiment of the present disclosure.

FIG. 19 is a circuit diagram illustrating a unit pixel 112_8 according to an example embodiment of the present disclosure, and FIG. 20 is a timing diagram illustrating an example of a method of driving a unit pixel of FIG. 19. A structure of the unit pixel 112_8 of FIG. 19 is similar to the structure of the unit pixel 112 of FIG. 2. Accordingly, the same or similar components may be marked by using the same or similar reference numerals/signs, and additional description associated with the same or similar components will be omitted to avoid redundancy.

Referring to FIG. 19, the unit pixel 112_8 includes one photo diode PD and six NMOS transistors TX, FX, RX1, RX2, DX, and SX. Unlike the unit pixel 112 of FIG. 2, the unit pixel 112_8 of FIG. 19 does not include boosting capacitors. The unit pixel 112_8 includes a first power supply voltage (Vpix_1) terminal and a second power supply voltage (Vpix_2) terminal that are independent of each other. The first power supply voltage terminal is connected with the first floating diffusion region FD1 through a first reset transistor RX1, and the second power supply voltage terminal is connected with the second floating diffusion region FD2 through the second reset transistor RX2. For convenience of description, it is assumed that a voltage of 1.8 V is provided as the first power supply voltage Vpix_1 and a voltage of 2.8 V is provided as the second power supply voltage Vpix_2.

Referring to FIG. 20, at point in time T0, the second reset transistor RX2, the floating diffusion region transistor FX, and the transfer transistor TX are turned on. Accordingly, the first floating diffusion region FD1, the second floating diffusion region FD2, and the photo diode PD are reset to a second power supply voltage Vpix_2.

At point in time T1, the second reset transistor RX2, the floating diffusion region transistor FX, and the transfer transistor TX are turned off, and the first floating diffusion region FD1 and second floating diffusion region FD2 are floated.

At point in time T2, a voltage level of the second floating diffusion region FD2 is sampled. The voltage level of the second floating diffusion region FD2 may be defined as a first reference voltage (1st reference voltage).

At point in time T3, as the floating control signal FG transitions to the high level, the first floating diffusion region FD1 and the second floating diffusion region FD2 are electrically connected with each other.

At point in time T4, a voltage level of the first and second floating diffusion regions FD1 and FD2 electrically connected is sampled. Because the first and second floating diffusion regions FD1 and FD2 are connected with each other, a full capacity may correspond to a sum (i.e., C1+C2) of a capacity of the first floating diffusion region FD1 and a capacity of the second floating diffusion region FD2. The voltage level of the first and second floating diffusion regions FD1 and FD2 may be defined as a second reference voltage (2nd reference voltage) and may be used as a reference voltage in the high-illumination mode.

At point in time T5, the transfer transistor TX is turned on, and charges integrated by the photo diode PD move to the first and second floating diffusion regions FD1 and FD2.

At point in time T6, a voltage level of the first and second floating diffusion regions FD1 and FD2 is sampled. The voltage level of the first and second floating diffusion regions FD1 and FD2 may be defined as a second signal voltage (2nd signal voltage), and may be compared with the second reference voltage such that a digital code is output. In this case, because all the capacities of the first and second floating diffusion regions FD1 and FD2 are used, the low conversion gain LCG may be provided.

At point in time T7, as a first reset signal RG1 transitions to the high level, the first reset transistor RX1 is turned on, and a first power supply voltage Vpix_1 lower than the second power supply voltage Vpix_2 is provided to the first floating diffusion region FD1. According to the above condition, the asymmetric potential structure in which a voltage level of the source is 1.8 V and a voltage level of the drain is 2.8 V is formed with respect to the floating diffusion region transistor FX. In this case, because the floating diffusion region transistor FX is in a turn-on state, charges of the first floating diffusion region FD1 may move to the second floating diffusion region FD2.

At point in time T8, the floating control signal FG transitions to the low level. As such, the floating diffusion region transistor FX is turned off, and charges present in the channel under the gate move to the drain by the asymmetric potential structure.

At point in time T9, a voltage level of the second floating diffusion region FD2 is sampled. The voltage level of the second floating diffusion region FD2 may be defined as a first signal voltage (1st signal voltage), and may be compared with the first reference voltage such that a digital code is output. Because only the capacity C2 of the second floating diffusion region FD2 is used, the high conversion gain HCG may be provided.

As described above, the unit pixel 112_8 according to an embodiment of the present disclosure may use independent power supply voltages instead of a boosting capacitor and may operate as in the unit pixel 112 of FIG. 2. In addition, although not illustrated, it may be understood that the unit pixel 112_8 according to an embodiment of the present disclosure may operate as in the unit pixel 112_2 (refer to FIG. 10) having the floating diffusion region sharing structure.

Figure 22:
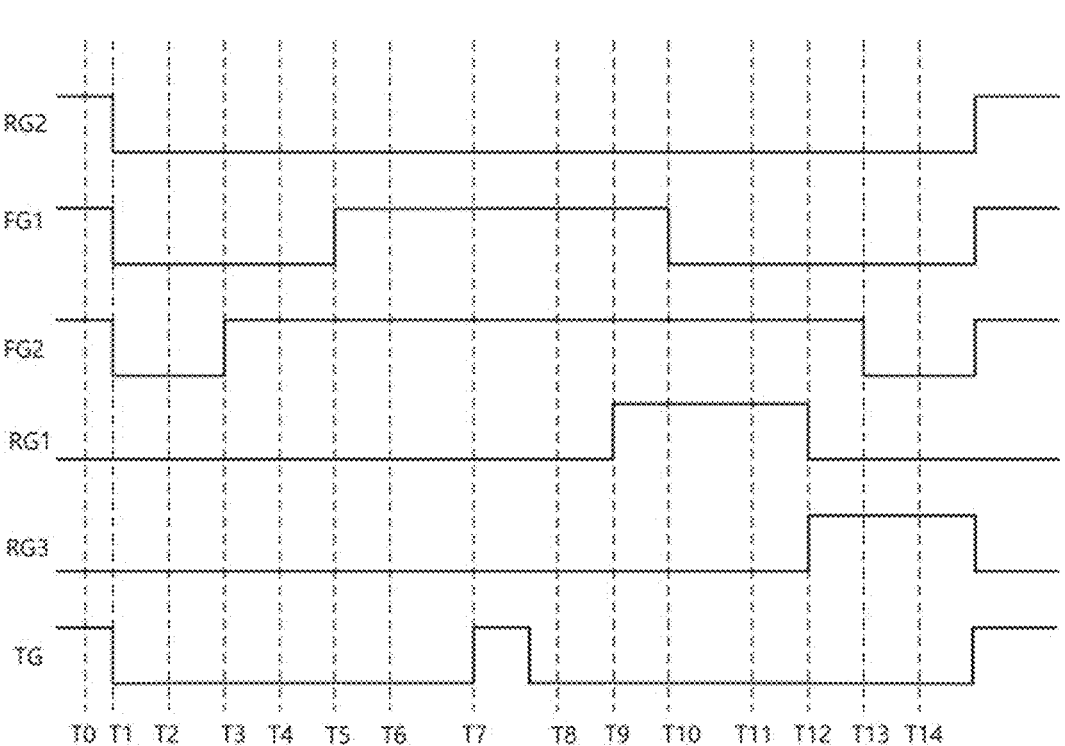
FIG. 22 is a timing diagram illustrating a method of driving a unit pixel of FIG. 21.

FIG. 21 is a circuit diagram illustrating a unit pixel 112_9 according to an example embodiment of the present disclosure, and FIG. 22 is a timing diagram illustrating an example of a method of driving the unit pixel 112_9 of FIG. 21. A structure of the unit pixel 112_9 of FIG. 21 is similar to the structure of the unit pixel 112_1 of FIG. 7. Accordingly, the same or similar components may be marked by using the same or similar reference numerals/signs, and additional description associated with the same or similar components will be omitted to avoid redundancy.

Referring to FIG. 21, the unit pixel 112_9 includes one photo diode PD and eight NMOS transistors TX, FX1, FX2, RX1, RX2, RX3, DX, and SX. The unit pixel 112_9 does not include boosting capacitors. The unit pixel 112_9 includes the first power supply voltage (Vpix_1) terminal and the second power supply voltage (Vpix_2) terminal, which are independent of each other, instead of boosting capacitors.

The first power supply voltage terminal is connected with the first and second floating diffusion regions FD1 and FD2 through the first and third reset transistors RX1 and RX3, and the second power supply voltage terminal is connected with the first floating diffusion region FD1 through the second reset transistor RX2. For convenience of description, it is assumed that a voltage of 1.8 V is provided as the first power supply voltage Vpix_1 and a voltage of 2.8 V is provided as the second power supply voltage Vpix_2.

Referring to FIG. 22, at point in time T0, the second reset transistor RX2, the first and second floating diffusion region transistors FX1 and FX2, and the transfer transistor TX are turned on. In this case, the first to third floating diffusion regions FD1 to FD3 and the photo diode PD are reset to the second power supply voltage Vpix_2.

At point in time T1, the second reset transistor RX2, the first and second floating diffusion region transistors FX1 and FX2, and the transfer transistor TX are turned off, and thus, the first to third floating diffusion regions FD1 to FD3 are floated.

At point in time T2, a voltage level of the third floating diffusion region FD3 is sampled. The voltage level of the third floating diffusion region FD3 may be defined as a first reference voltage (1st reference voltage).

At point in time T3, the second floating control signal FG2 transitions to the high level, and thus, the second floating diffusion region FD2 and the third floating diffusion region FD3 are electrically connected with each other.

At point in time T4, a voltage level of the second and third floating diffusion regions FD2 and FD3 electrically connected is sampled. The voltage level of the second and third floating diffusion regions FD2 and FD3 may be defined as a second reference voltage (2nd reference voltage).

At point in time T5, the first floating control signal FG1 transitions to the high level, and thus, the first to third floating diffusion regions FD1 to FD3 are electrically connected from each other.

At point in time T6, a voltage level of the first to third floating diffusion regions FD1 to FD3 electrically connected is sampled. The voltage level of the first to third floating diffusion regions FD1 to FD3 may be defined as a third reference voltage (3rd reference voltage).

At point in time T7, the transfer signal TG transitions to the high level. As such, charges integrated by the photo diode PD move to the first to third floating diffusion regions FD1 to FD3 electrically connected with each other.

At point in time T8, a voltage level of the first to third floating diffusion regions FD1 to FD3 is sampled. The voltage level of the first to third floating diffusion regions FD1 to FD3 may be defined as a third signal voltage (3rd signal voltage), and may be compared with the third reference voltage such that a digital code is output. In this case, because all the capacities of the first to third floating diffusion regions FD1 to FD3 are used, the low conversion gain LCG may be provided.

At point in time T9, as the first reset transistor RX1 is turned on, the first power supply voltage Vpix_1 of 1.8 V is provided to the first floating diffusion region FD1. According to the above condition, the asymmetric potential structure in which a voltage level of the source is 1.8 V and a voltage level of the drain is 2.8 V is formed with respect to the first floating diffusion region transistor FX1. Because the first floating diffusion region transistor FX1 is in a turn-on state, charges of the first floating diffusion region FD1 move to the second and third floating diffusion regions FD2 and FD3.

At point in time T10, the first floating diffusion region transistor FX1 is turned off, and charges present in the channel under the gate move to the drain by the asymmetric potential structure.

At point in time T11, a voltage level of the second and third floating diffusion regions FD2 and FD3 is sampled. The voltage level of the second and third floating diffusion regions FD2 and FD3 may be defined as a second signal voltage (2nd signal voltage), and may be compared with the second reference voltage such that a digital code is output. In this case, because the capacities of the second and third floating diffusion regions FD2 and FD3 are used, the medium conversion gain MCG may be provided.

At point in time T12, as the third reset transistor RX3 is turned on, the first power supply voltage Vpix_1 of 1.8 V is provided to the second floating diffusion region FD2. According to the above condition, the asymmetric potential structure in which a voltage level of the source is lower than a voltage level of the drain is formed with respect to the second floating diffusion region transistor FX2, and charges move to the third floating diffusion region FD3.

At point in time T3, the second floating diffusion region transistor FX2 is turned off, and charges present in the channel under the gate move to the drain by the asymmetric potential structure.

At point in time T14, a voltage level of the third floating diffusion region FD3 is sampled. The voltage level of the third floating diffusion region FD3 may be defined as a first signal voltage (1st signal voltage), and may be compared with the first reference voltage such that a digital code is output.

As described above, the unit pixel 112_9 according to an embodiment of the present disclosure may use independent power supply voltages instead of a boosting capacitor and may operate as in the unit pixel 112_1 of FIG. 7. In addition, although not illustrated, it may be understood that the unit pixel 112_9 according to an embodiment of the present disclosure may operate as in the unit pixel 112_3 (refer to FIG. 12) having the floating diffusion region sharing structure.

[Transistor with Asymmetric Device Structure]

Above, embodiment of the present disclosure, in which a floating diffusion region transistor has the asymmetric potential structure between the source and the drain, are illustrated and described. However, this is provided as an example, and the present disclosure is not limited thereto. For example, the floating diffusion region transistor according to an embodiment of the present disclosure may be implemented to have the asymmetric device structure and may minimize the signal loss due to the charge injection through the asymmetric device structure.

Figure 23:
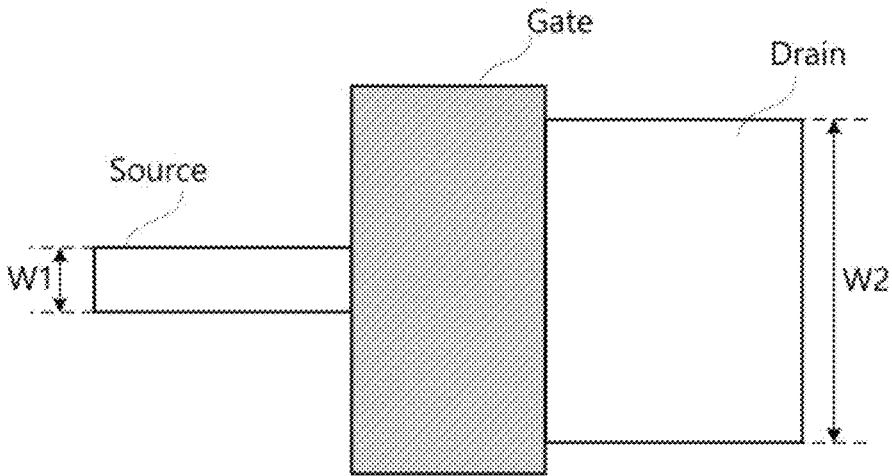
FIG. 23 is a diagram illustrating an example of a transistor structure, according to an example embodiment of the present disclosure.

FIG. 23 is a diagram illustrating an example of a transistor structure according to an example embodiment of the present disclosure. A transistor of FIG. 23 may be one of the floating diffusion region transistors described with reference to FIGS. 1 to 22.

According to an embodiment of the present disclosure, the transistor with the asymmetric device structure may be implemented by making a width of a source and a width of a drain different from each other. For example, as illustrated in FIG. 23, a transistor may be formed such that a width W1 of the source is smaller than a width W2 of the drain. Herein, the width may mean a length of an area in which the source/drain is defined, when viewed in a horizontal direction. In this case, because a resistance of the source is greater than a resistance of the drain, charges accumulated in the channel under the gate during the turn-on of the transistor move to the drain whose resistance is small when the transistor is turned off. Accordingly, the signal loss due to the charge injection may be minimized.

Also, according to an embodiment of the present disclosure, the transistor with the asymmetric device structure may be implemented by making a doping concentration of a source and a doping concentration of a drain different from each other. For example, the doping concentration of the source may be implemented to be lower than the doping concentration of the drain. In this case, because a resistance of the source whose doping concentration is low is substantially greater than a resistance of the drain whose doping concentration is high, charges accumulated in the channel under the gate during the turn-on of the transistor move to the drain whose resistance is small when the transistor is turned off. Accordingly, the signal loss due to the charge injection may be minimized.

An image sensor according to an embodiment of the present disclosure may allow charges integrated by a photo diode to move to a node, at which a sensing operation is performed, without the loss. Accordingly, a high-definition image may be generated.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An image sensor comprising:
   a photo diode configured to generate charges based on an incident light;
   a first floating diffusion region configured to store the charges generated by the photo diode;

a first boosting capacitor connected with the first floating diffusion region;

a second floating diffusion region disposed to be spaced apart from the first floating diffusion region and including a first end connected with a gate of a drive transistor;

a transfer transistor configured to electrically connect the photo diode with the first floating diffusion region in response to a transfer signal;

a floating diffusion region transistor configured to electrically connect the first floating diffusion region with the second floating diffusion region in response to a floating control signal; and a second boosting capacitor connected with the second floating diffusion region, wherein a positive voltage is provided to the second boosting capacitor while a negative voltage is provided to the first boosting capacitor.

2. The image sensor of claim 1, wherein the positive voltage is provided to the first boosting capacitor, with the transfer transistor turned on.

3. The image sensor of claim 1, further comprising:

a third floating diffusion region disposed between the first and second floating diffusion regions so as to be spaced apart from each other; and an additional floating diffusion region transistor disposed between the third floating diffusion region and the second floating diffusion region, wherein, in response to the floating control signal, the floating diffusion region transistor electrically connects the first floating diffusion region with the third floating diffusion region or disconnects the first floating diffusion region from the third floating diffusion region, and wherein, in response to an additional floating control signal, the additional floating diffusion region transistor electrically connects the third floating diffusion region with the second floating diffusion region or disconnects the third floating diffusion region from the second floating diffusion region.

4. The image sensor of claim 3, further comprising:

a third boosting capacitor connected with the third floating diffusion region.

5. The image sensor of claim 4, wherein a positive voltage is provided to the third boosting capacitor while a negative voltage is provided to the first boosting capacitor, and wherein the positive voltage is provided to the second boosting capacitor while the negative voltage is provided to the first boosting capacitor.

6. The image sensor of claim 1, wherein a source region of the floating diffusion region transistor is connected with the first floating diffusion region, and a drain region of the floating diffusion region transistor is connected with the second floating diffusion region, and wherein a width of the source region in a first direction is smaller than a width of the drain region in the first direction in a plan view.

7. The image sensor of claim 1, wherein a source region of the floating diffusion region transistor is connected with the first floating diffusion region, and a drain region of the floating diffusion region transistor is connected with the second floating diffusion region, and wherein a doping concentration of the source region of the floating diffusion region transistor is lower than a doping concentration of the drain region of the floating diffusion region transistor.

8. An image sensor comprising:

a photo diode configured to generate charges in response to an incident light;

a first floating diffusion region configured to store the charges generated by the photo diode;

a first reset transistor configured to electrically connect a first power supply voltage terminal with the first floating diffusion region in response to a first reset signal;

a second floating diffusion region disposed to be spaced apart from the first floating diffusion region and including a first end connected with a gate of a drive transistor;

a second reset transistor configured to electrically connect the first power supply voltage terminal with the second floating diffusion region in response to a second reset signal;

a third floating diffusion region electrically connected between the first and second floating diffusion regions;

a third reset transistor configured to electrically connect a second power supply voltage terminal different from the first power supply voltage terminal with the third floating diffusion region in response to the first reset signal;

a transfer transistor configured to electrically connect the photo diode with the first floating diffusion region in response to a transfer signal; and a floating diffusion region transistor configured to electrically connect the first floating diffusion region with the second floating diffusion region in response to a floating control signal, wherein the second power supply voltage terminal is connected in common to the third reset transistor and the drive transistor, and wherein, in a state where the floating diffusion region transistor is turned on the first reset transistor is turned on and the third reset transistor is turned off.

9. The image sensor of claim 8, wherein a voltage level provided to the first power supply voltage terminal is lower than a voltage level provided to the second power supply voltage terminal.

10. The image sensor of claim 8, further comprising:

an additional floating diffusion region transistor disposed between the third floating diffusion region and the second floating diffusion region, wherein the floating diffusion region transistor is electrically connected between the first and third floating diffusion regions, wherein, in response to the floating control signal, the floating diffusion region transistor electrically connects the first floating diffusion region with the third floating diffusion region or disconnects the first floating diffusion region from the third floating diffusion region, and wherein, in response to an additional floating control signal, the additional floating diffusion region transistor electrically connects the third floating diffusion region with the first floating diffusion region or disconnects the third floating diffusion region from the first floating diffusion region.

11. A driving method of an image sensor, the method comprising:

turning on a transfer transistor to transfer charges generated by a photo diode to a first floating diffusion region;

after turning off the transfer transistor, decreasing a voltage level of the first floating diffusion region by applying a negative voltage signal to a boosting capacitor connected with the first floating diffusion region;

increasing a voltage level of a second floating diffusion region such that the voltage level of the first floating diffusion region is lower than the voltage level of the second floating diffusion region;

turning on a floating diffusion region transistor in a state where the voltage level of the first floating diffusion region decreases, such that charges integrated in the first floating diffusion region are transferred to the second floating diffusion region physically spaced apart from the first floating diffusion region; and sampling a voltage formed in the second floating diffusion region, wherein the increasing the voltage level of the second floating diffusion region comprises increasing the voltage level of the second floating diffusion region while the negative voltage signal is applied to the boosting capacitor.

12. The method of claim 11, further comprising:

before the charges integrated in the first floating diffusion region are transferred to the second floating diffusion region, electrically connecting the second floating diffusion region with a third floating diffusion region disposed between the first and second floating diffusion regions.

13. The method of claim 12, further comprising:

sampling a voltage formed in the second and third floating diffusion regions that are electrically connected.

14. The method of claim 13, further comprising:

after the voltage formed in the second and third floating diffusion regions is sampled, decreasing a voltage level of the third floating diffusion region.

15. The method of claim 14, further comprising:

electrically disconnecting the third floating diffusion region from the second floating diffusion region in a state where the voltage level of the third floating diffusion region decreases.

16. The method of claim 15, wherein the sampling of the voltage formed in the second floating diffusion region is performed after electrically disconnecting the third floating diffusion region from the second floating diffusion region.

* * * * *